United States Patent [19]
McEwan

[11] Patent Number: 5,471,162
[45] Date of Patent: Nov. 28, 1995

[54] HIGH SPEED TRANSIENT SAMPLER

[75] Inventor: Thomas E. McEwan, Livermore, Calif.

[73] Assignee: The Regents of the University of California, Oakland, Calif.

[21] Appl. No.: 942,164

[22] Filed: Sep. 8, 1992

[51] Int. Cl.⁶ .................................................. H03K 5/125
[52] U.S. Cl. .............................. 327/92; 327/94; 327/251; 327/271; 327/565
[58] Field of Search ................................ 328/55, 56, 150, 328/151; 307/352, 353, 602; 377/76; 324/76.15; 327/91, 92, 94, 250, 251, 271, 325, 564, 565

[56] References Cited

U.S. PATENT DOCUMENTS

| | | | |
|---|---|---|---|
| 3,209,263 | 9/1965 | Keiper, Jr. | 328/55 |
| 3,596,191 | 7/1971 | Stuckert | 328/151 |
| 4,504,791 | 3/1985 | Conway et al. | 328/56 |
| 4,621,217 | 11/1986 | Saxe et al. | 328/151 |
| 4,825,103 | 4/1989 | Hornak | 307/353 |
| 4,833,445 | 5/1989 | Buchele | 328/151 |
| 4,866,711 | 9/1989 | Borup et al. | 370/108 |

OTHER PUBLICATIONS

Radio Shack Dictionary of Electronics, p. 615, Rudolf F. Graf, 1975 (month unknown).
Sedlmeyer, et al., "Analyser For Fast Single Events", Nuclear Electronics III, by the International Atomic Energy Agency, Vienna, 1962, month unknown.
Schwarte, "Sampling System For Recording Fast Single Events", Electronics Letters, vol. 8, No. 4, Feb. 24, 1992.
Riad, "Modeling Of The HP-1430A Feedthrough Wide-Band (28-ps) Sampling Head", IEEE Transactions on Instrumentation and Measurement, vol. IM-31, No. 2, Jun., 1982, pp. 110-115.
Rodwell, et al., "GaAs Nonlinear Transmission Lines For Picosecond Pulse Generation And Millimeter-Wave Sampling", IEEE TMTT, vol. 39, No. 7, Jul., 1991, pp. 1194-1204.
Grove, "Sampling For Oscilloscopes And Other RF Systems: Dc Through X-Band", IEEE TMTT, vol. MTT-14, No. 12, pp. 629-635, Dec., 1966.
Miura, et al., "Monolithic Sampling Head IC", IEEE TMTT, vol. MTT-38, No. 12, pp. 1980-1985, Dec., 1990.
Miura, et al., "Full Monolithic Sampling Head IC", IEEE MTT-S Digest, PP. 845-848, 1990, month unknown.
Brochure for "Bridge Quad Five Barrier Heights", from Metelics Corporation, date unknown.

Primary Examiner—Andrew M. Dolinar
Attorney, Agent, or Firm—Henry P. Sartorio

[57] ABSTRACT

A high speed sampler comprises a meandered sample transmission line for transmitting an input signal, a straight strobe transmission line for transmitting a strobe signal, and a plurality of sampling gates along the transmission lines. The sampling gates comprise a four terminal diode bridge having a first strobe resistor connected from a first terminal of the bridge to the positive strobe line, a second strobe resistor coupled from the third terminal of the bridge to the negative strobe line, a tap connected to the second terminal of the bridge and to the sample transmission line, and a sample holding capacitor connected to the fourth terminal of the bridge. The resistance of the first and second strobe resistors is much higher than the signal transmission line impedance in the preferred system. This results in a sampling gate which applies a very small load on the sample transmission line and on the strobe generator. The sample holding capacitor is implemented using a smaller capacitor and a larger capacitor isolated from the smaller capacitor by resistance. The high speed sampler of the present invention is also characterized by other optimizations, including transmission line tap compensation, stepped impedance strobe line, a multi-layer physical layout, and unique strobe generator design. A plurality of banks of such samplers are controlled for concatenated or interleaved sample intervals to achieve long sample lengths or short sample spacing.

91 Claims, 13 Drawing Sheets

HIGH SPEED TRANSIENT SAMPLER

The United States government has rights in this invention pursuant to Contract Number W-7405-ENG-48 between the United States Department of Energy and the University of California for the operation of Lawrence Livermore National Laboratory.

BACKGROUND OF THE INVENTION

1. Field of the Invention

The present invention relates to the samplers used for measuring characteristics of high speed signals, such as used with transient digitizers and high speed oscilloscopes.

2. Description of Related Art

A conventional oscilloscope displays a waveform in step with an external event, or in "real time". The trace of the waveform sweeps across the screen in a matter of nanoseconds or picoseconds, for example, and then quickly fades. For a human observer to see the trace, repeated sweeps are usually needed to make the trace appear with an observable, steady brightness. Thus, a repetitive input signal is required. Transient digitizers circumvent the need for a repeated input by electrically recording the transient event in real time for later readout or viewing at a much slower rate, in what is known as "equivalent time".

There are two basic types of transient digitizers on the commercial market, one based on CRT technology and the other based on a continuously running Analog-to-Digital Converter (ADC). The fastest of the two are the CRT-based digitizers, and they are based on a dual electron-beam approach. One beam operates in real time and writes a trace onto a screen containing a charge-storing diode array. The diode array captures the charge deposited by the "writing" beam and that charge is later read-out by a "read" beam at a slow, equivalent-time rate. The disadvantage to the CRT approach lies in the expensive and bulky CRT, and ultimately, in its limited bandwidth. Two companies of which Applicant is aware offer a CRT-based digitizer, an 80 picosecond risetime unit by Tektronix and a 50 picosecond unit by Intertechnique of France.

The continuously running Analog-to-Digital Converter (ADC) electrically samples the signal and very rapidly converts the sample to a digital number for real-time storage in digital memory. The limitation to the ADC digitizer is that it must perform complicated operations in real-time, i.e., convert signals to binary data and store the result in a large digital memory array before the next sample is taken. The fastest ADC-based digitizer is about 10 times slower than a CRT digitizer and requires a large amount of power and cooling. Nevertheless, these relatively low bandwidth ADC devices have been at the focus of the electronics marketplace since they are the core technology of a recent oscilloscope development, the Digital Storage Oscilloscope (DSO). DSOs can function as transient digitizers at speeds running 10–1000 times slower than CRT-based digitizers.

Other prior art digitizers are based on a periodically-tapped transmission line, with a sample and hold circuit located at each tap. See, U.S. Pat. No. is 4,825,103, entitled SAMPLE AND HOLD CIRCUIT, invented by Hornak; Sedlmeyer, et al., "ANALYZER FOR FAST SINGLE EVENTS", reprinted from "NUCLEAR ELECTRONICS III" by the International Atomic Energy Agency Vienna, 1962; Schwarte, "Sampling System for Recording Fast Single Events", ELECTRONICS LETTERS, Vol. 8, No. 4, Feb. 24, 1972; Riad, "Modeling of the HP-1430A Feedthrough Wideband (25-ps) Sampling Head", IEEE TRANSACTIONS ON INSTRUMENTATION AND MEASUREMENT, Vol. IM-31, No. 2, June, 1982, pp. 110–115.

The tapped-transmission line architecture is attractive for a number of reasons. First, the sample and hold circuits located at each tap can operate at speeds well above that of the competing technologies. Experimental single samplers have been operated at 1.3 ps risetime. Rodwell, et al., "GaAs Nonlinear Transmission Lines for Picosecond Pulse Generation and Millimeter Wave Sampling", IEEE TRANSACTIONS ON MICROWAVE THEORY AND TECHNIQUES, Vol. 39, No. 7, July, 1991, pp. 1194–1204. In contrast, CRT technology is believed to be limited to about 50 ps.

Accordingly, it is desirable to provide a tapped transmission line architecture which provides a robust and simple design for practical applications.

SUMMARY OF THE INVENTION

The present invention provides a high speed sampler which comprises a sample transmission line for transmitting an input signal, a strobe transmission line for transmitting a strobe signal, and a plurality of sampling gates at respective positions along the sample transmission line for sampling the input signal in response to the strobe signal.

The sampling gates comprise a four diode bridge having a first strobe resistor connected from a first terminal of the bridge to the positive strobe line, a second strobe resistor coupled from the third terminal of the bridge to the negative strobe line, a tap connected to the second terminal of the bridge and to the sample transmission line, and a sample holding capacitor connected to the fourth terminal of the bridge. The resistance of the first and second strobe resistors is much higher than the sample transmission line impedance in the preferred system. This results in a sampling gate which applies a very small load on the sample transmission line and on the strobe generator.

According to another aspect of the invention, the sample holding capacitor is implemented using a smaller capacitance and a larger capacitance isolated from the smaller capacitance by resistance. This allows decoupling of the charge collected by the sample gate from a buffer amplifier which is connected to, or includes, the relatively larger capacitance. The impedance causes the rise time on the relatively larger capacitance to be much slower than that of the smaller capacitance coupled to the sampling gate allowing use of a narrower bandwidth buffer amplifier and providing other benefits.

The high speed sampler of the present invention is also characterized by other optimizations, including line tap compensation, stepped impedance strobe line, a multi-layer physical layout, and unique strobe generator designs.

The sampler architecture outlined above can be enhanced by utilization of anti-aliasing filters on the input of the sample transmission line. In addition, a circuit for scanning out the samples from the sampling gates is included which may be coupled with a sample reconstruction filter to reconstruct an analog version of the input signal. Alternatively, the output of the scanning circuit can be supplied to digitizers which generate digital representations of each sample for storage and later use.

One implementation of the sampling gate according to the present invention requires a relatively large strobe voltage with a short duration. Thus, unique strobe generators have been devised based on cascaded step recovery diode in one embodiment and shock line technology in another embodiment. These circuits provide transitions having amplitude several times higher than is commercially available to establish gate widths on the order of 25 picoseconds.

Furthermore, the present invention can be characterized by the control circuits for supplying the strobe signals. The control circuits provide for co-propagating strobe and signal flow, and by controlling the timing of the strobe signals to a plurality of banks of samplers, either interleaved or concatenated sample sets may be generated.

In yet another aspect, the present invention can be characterized as a tapped transmission line sampling system which has an effective time between samples of less than 150 picoseconds, and in certain configurations, less than 30 picoseconds. The time between samples is critical for making accurate reconstructions of high speed signals in many fields and for use in markets previously unaccessible using tapped transmission line architectures.

Other aspects and advantages of the present invention can be seen upon review of the figures, the detailed description, and the claims which follow.

DESCRIPTION OF THE PREFERRED EMBODIMENTS

Figure 10:
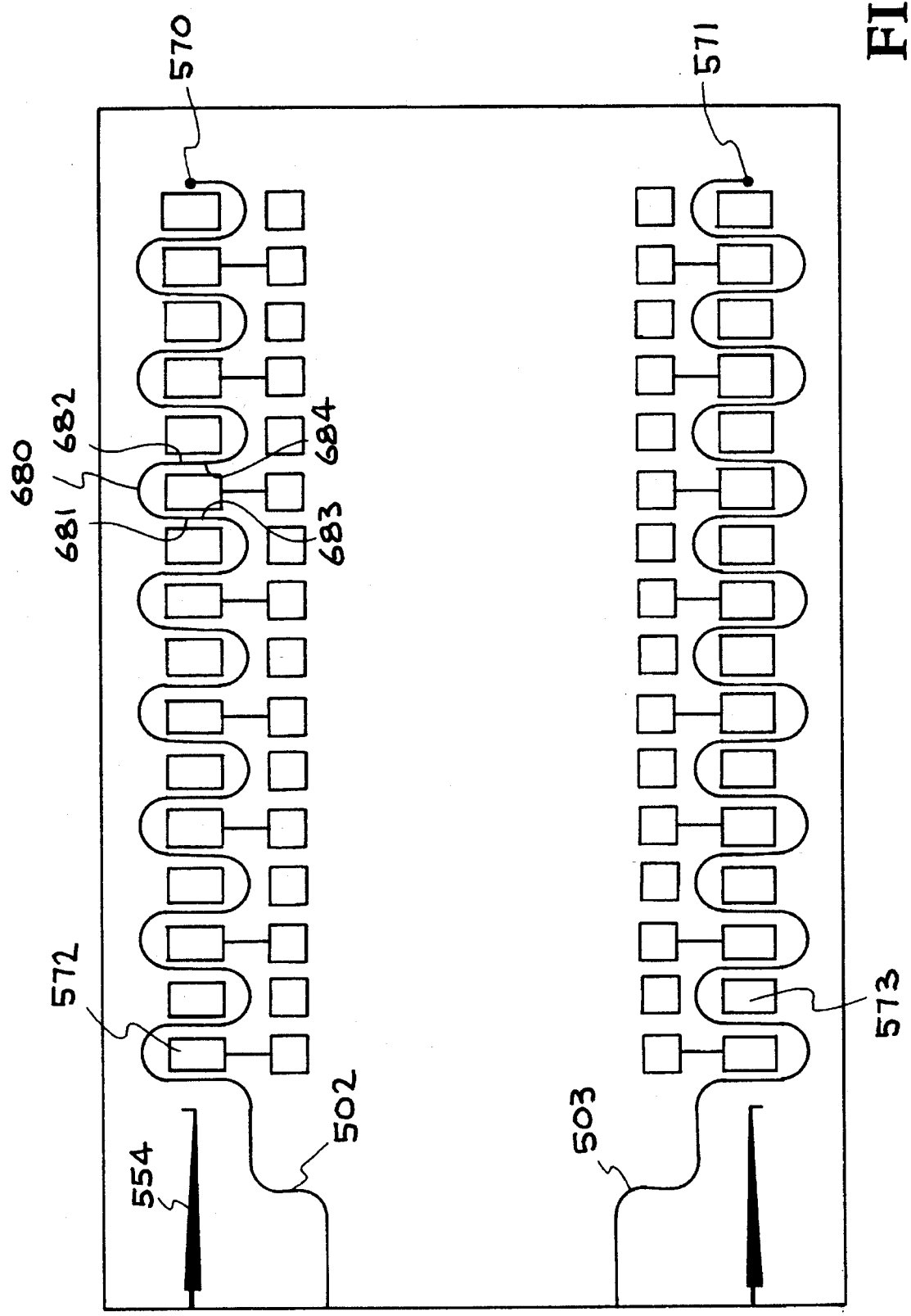
FIG. 10 is a layout diagram illustrating the configuration of the transmission line on a top layer of a multi-layer circuit board for the circuit of FIGS. 8A and 8B.
Figure 11:
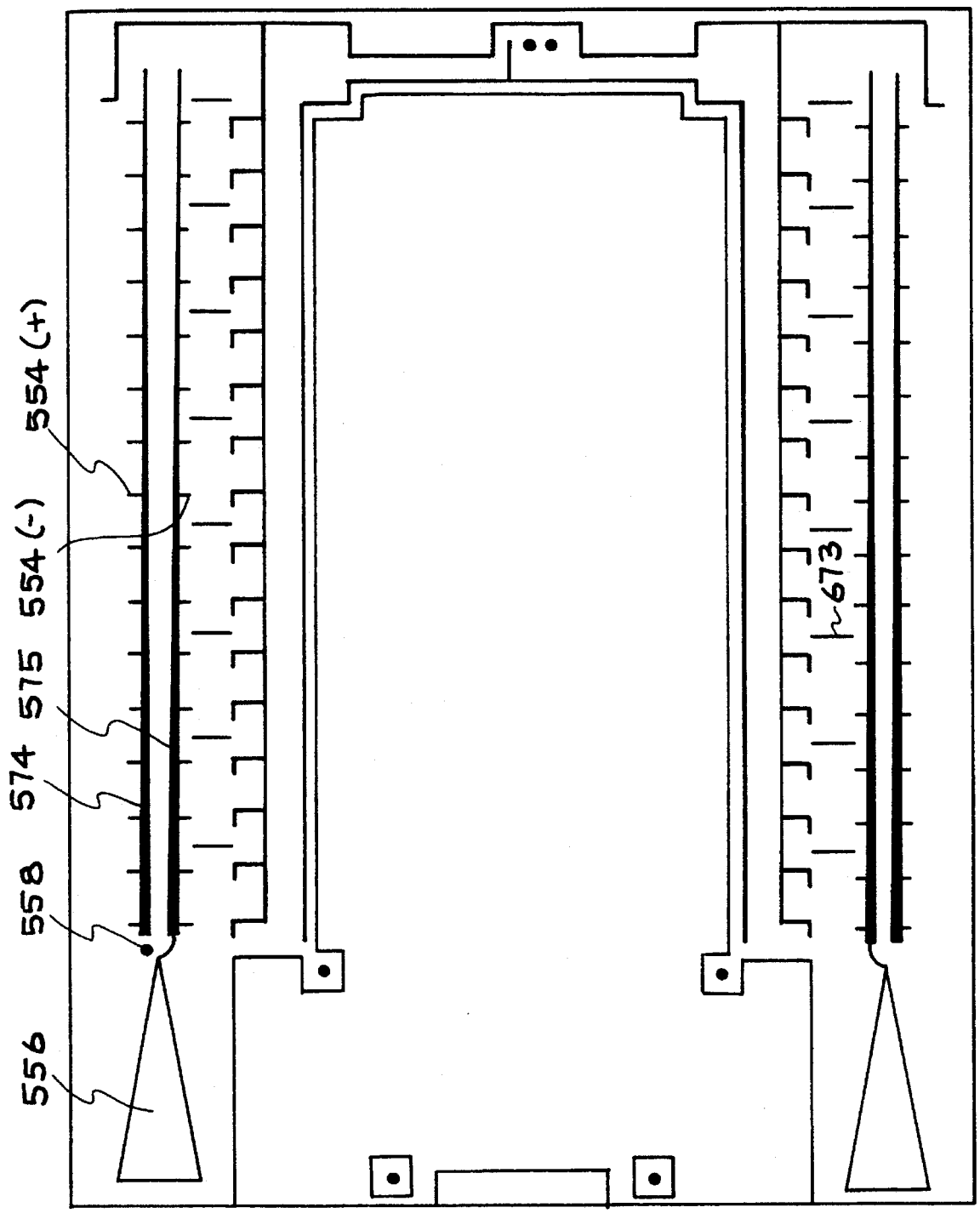
FIG. 11 is a layout diagram of a bottom layer of the multi-layer circuit board illustrating the configuration of the strobe lines for the circuit of FIGS. 8A and 8B.
Figure 12:
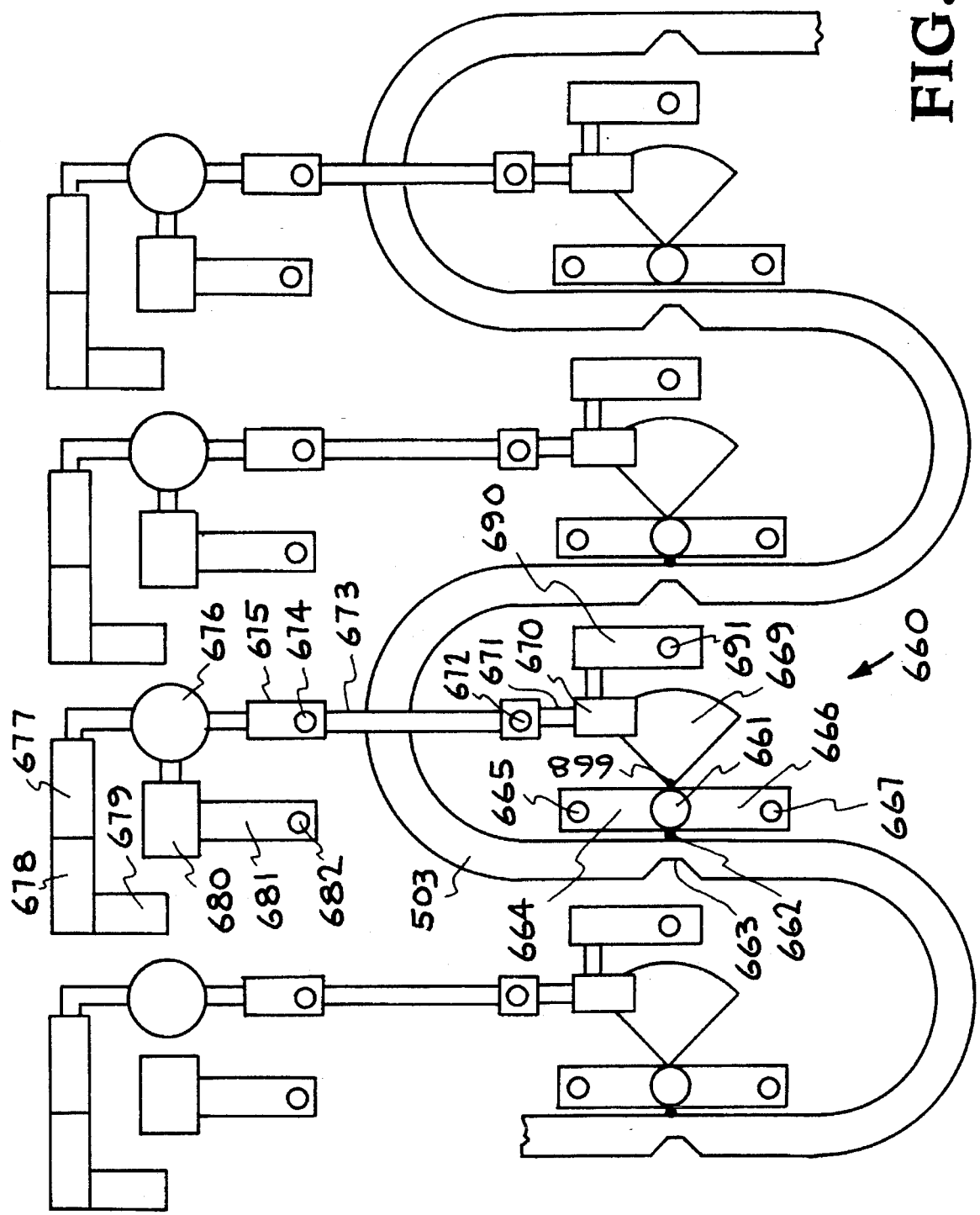
FIG. 12 is an expanded view of the layout of a section of the transmission line and the circuit components for the circuit of FIGS. 8A and 8B.
Figure 13:
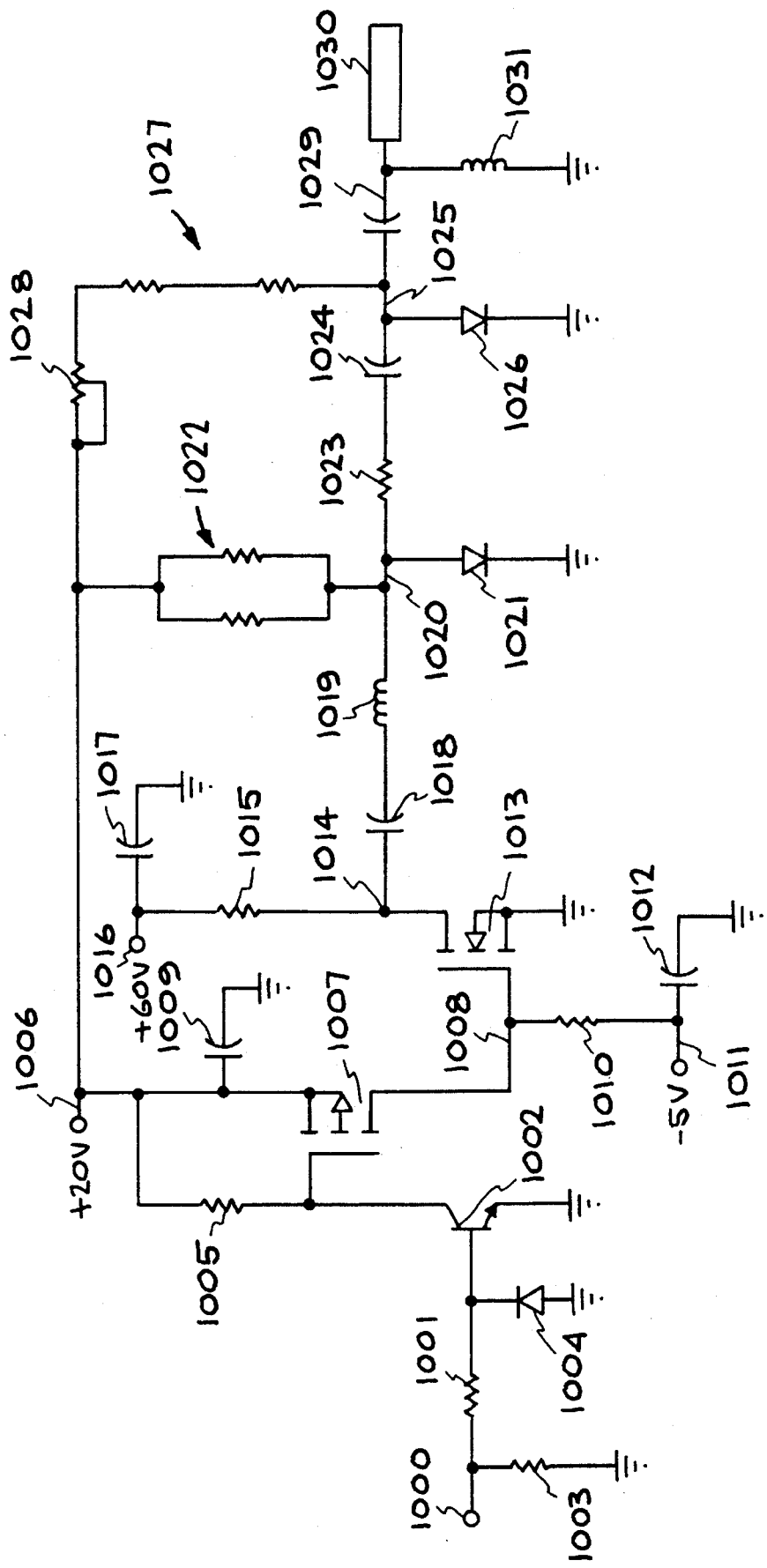
FIG. 13 is a schematic diagram of a cascaded step recovery diode impulse generator which may be used for generating a strobe pulse according to the present invention.
Figure 14:
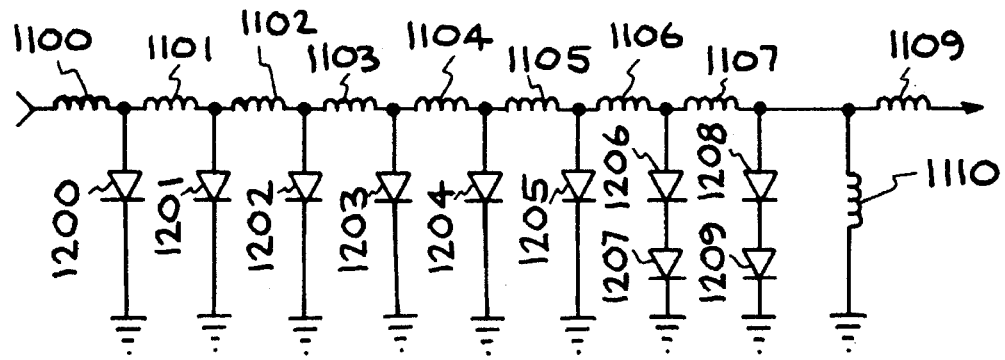
FIG. 14 is a schematic diagram of a shock line implementation of an impulse generator which may be used for generating the strobe pulse of the present invention.
Figure 15:
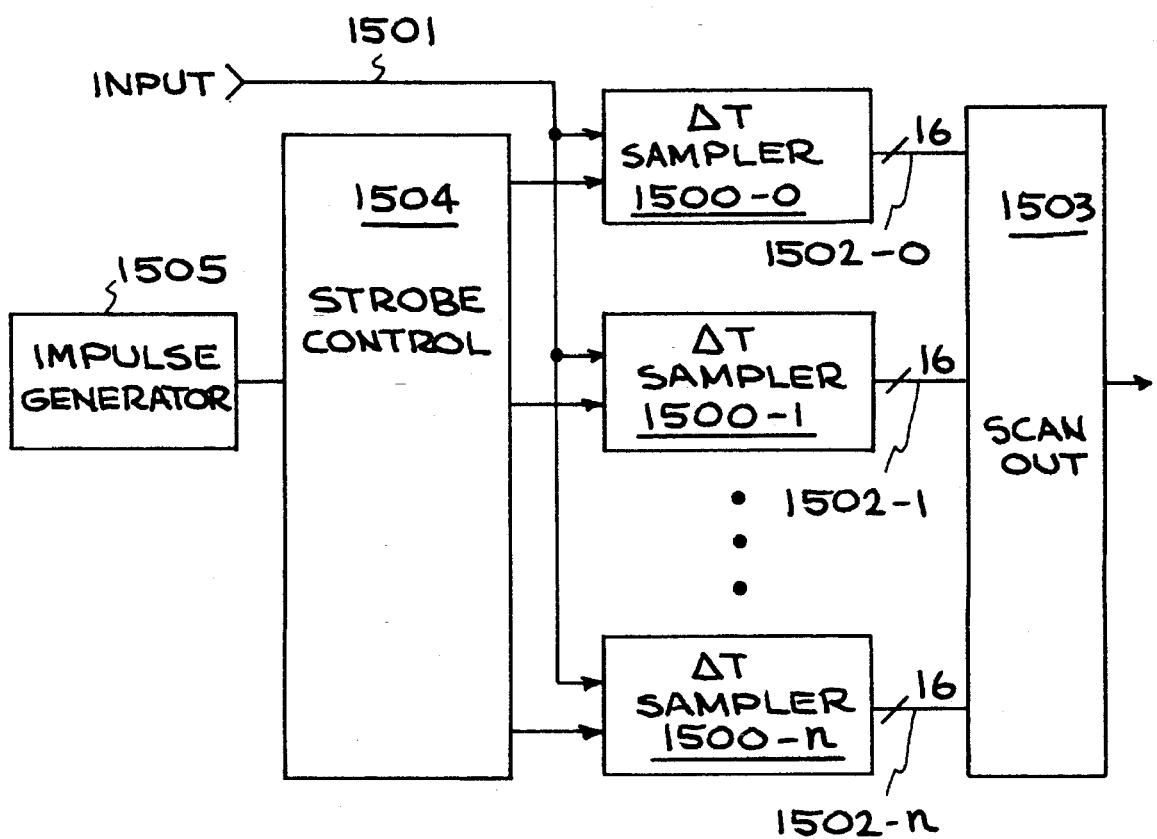
FIG. 15 is a schematic block diagram of a multi-bank high speed sampler according to the present invention.

A detailed description of the present invention is provided with respect to the figures. FIGS. 1, 2, and 5–7 illustrate the architecture and the basic components of a high speed sampler according to the present invention. FIGS. 8A, 8B, 9A, and 9B are a detailed schematic diagram of a high speed sampler according to the present invention. FIGS. 10, 11, and 12 illustrate the circuit board implementation of a preferred embodiment of the present invention. FIGS. 13 and 14 illustrate the manner in which the strobe pulse may be generated for driving samplers according to the present invention. FIG. 15 shows one preferred embodiment including multiple banks of samplers.

System Architecture

Figure 1:
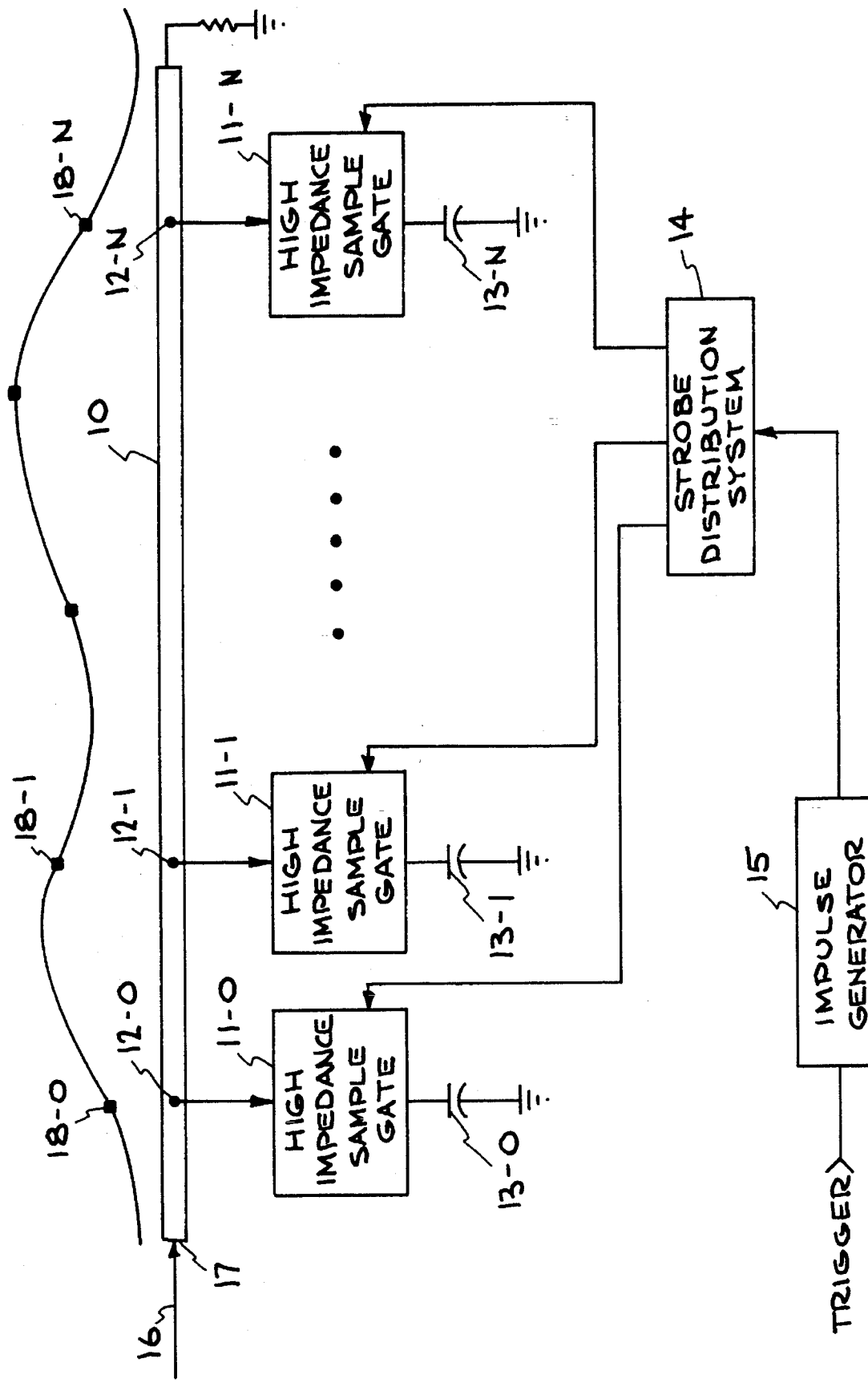
FIG. 1 is a schematic diagram of a high speed sampler according to the present invention.

As illustrated in FIG. 1, the present invention is based on a tapped transmission line 10 having a plurality of voltage sampling circuits 11-0 through 11-N connected to a plurality of tapped positions 12-0 through 12-N on the transmission line. The sampling gates are coupled with respective sample holding capacitors 13-0 through 13-N. In addition, each of the samplers 11-0 through 11-N is coupled to a circuit 14 for distributing a strobe signal, such as a strobe transmission line. An impulse generator 15 is connected to the strobe distribution circuit 14.

In operation, an input signal 16 is applied to a first end 17 of the transmission line 10. It propagates along the length of the line. Due to the finite velocity of propagation along the line, various portions 18-0, 18-1, . . . , 18-N of the signal appear at each tap at a given instant in time. If each sampler at each tap is simultaneously made to sample, or strobed, a discrete replica of the signal will be retained by the charge holding capacitors 13-0, 13-1 through 13-N.

The duration that the samplers are gated open, or strobed, is short compared to the fastest characteristic of the signal on the transmission line. A short gate duration reduces the smearing effect caused by the propagation speed of the signal waveform. In one present reduction to practice, the gate open duration is on the order of 25 picoseconds. This theoretically limits the maximum bandwidth to less than 40 Gigahertz. Shorter strobe gates can be used to achieve even greater frequencies.

Once the samples are taken and stored on the charge holding capacitors 13-0 through 13-N, the samples may be read out sequentially at a low rate. This allows a wide variety of applications of the samplers such as those described with reference to FIG. 2.

Samplers for operating at this speed must be high impedance samplers which apply a very small Icad on the transmission line and strobe circuit. Accordingly, high impedance four diode sampling gates have been developed to meet this need. These sampling gates are described in more detail below. Specifically, the sampling gate must not Icad the transmission line excessively or the signal would be severely attenuated as it passes along the line. Further, it must not Icad the strobe circuit excessively or unrealistic strobe voltages would be needed.

Figure 2:
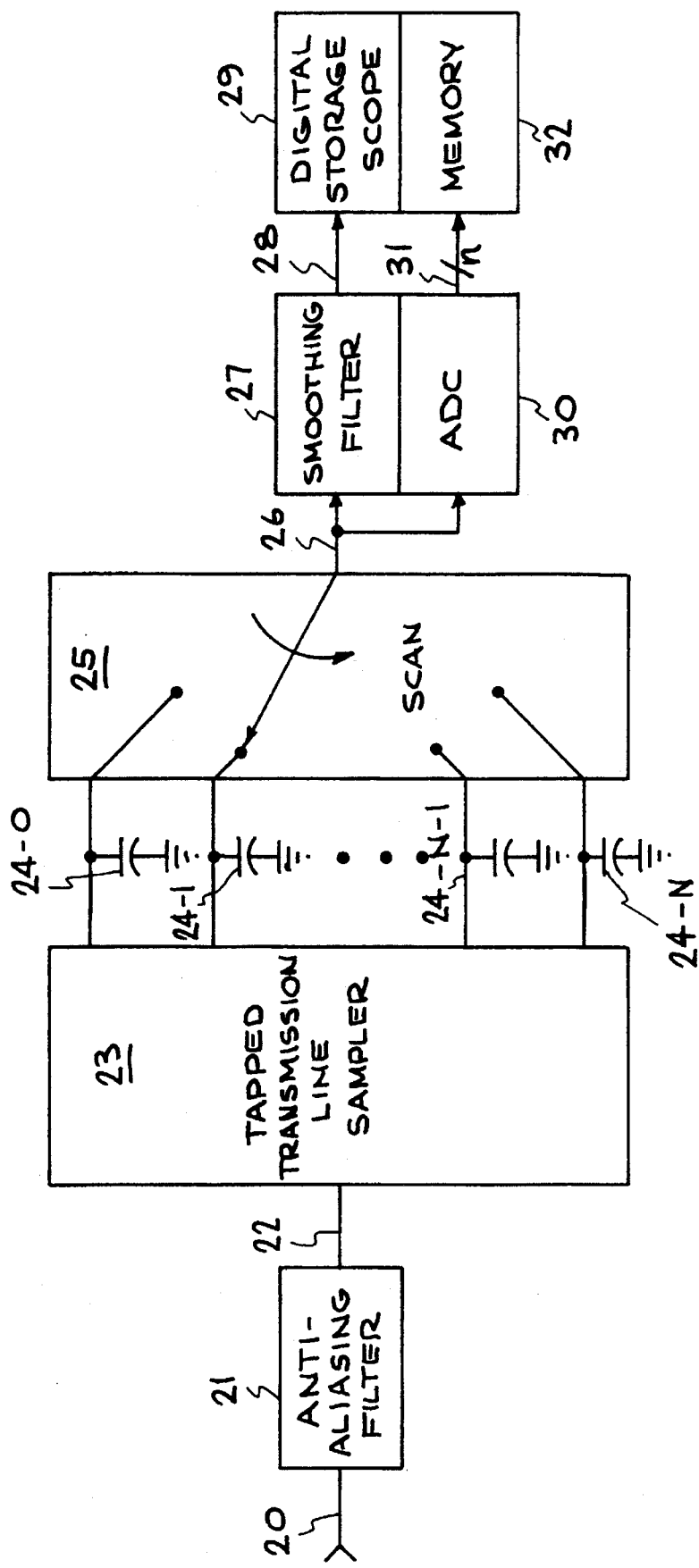
FIG. 2 is a schematic diagram of a system for reconstructing an input signal in equivalent time, and digitizing an input signal.

FIG. 2 illustrates two representative applications of the present invention in a single system. According to FIG. 2, the input signal is supplied on line 20. Line 20 is coupled to an anti-aliasing filter 21. The output of the anti-aliasing filter is supplied on line 22 as the input to the tapped transmission line sampler 23 such as described with reference to FIG. 1. The charge holding capacitors 24-0 through 24-N of the tapped transmission line sampler 23 are coupled to a scanning circuit 25. The output of the scanning circuit is supplied on line 26, and has a form substantially of a bar graph as illustrated in the figure. This output may be supplied to a smoothing filter 27, which reconstructs the input signal on line 28 in equivalent time. With the equivalent time reconstruction of the signal on line 28, a digital storage scope 29 may be used to display a trace of the signal.

Alternatively, the signal on line 26 may be supplied to an analog-to-digital converter 30. Because the sample rate of the scanner 25 is much slower than the sample rate of the sampler 23, the analog-to-digital converter 30 may be implemented using any of a variety of standard techniques. The output of the analog-to-digital converter is supplied on an N-bit bus 31 to a digital memory 32, where it may be stored for a variety of uses.

According to one implementation, the tapped transmission line sampler 23 has supplied samples on sample holding capacitors 24-0 through 24-N which are spaced in time at about 30 picoseconds on the input signal. The scanner 25 scans each of the charge holding capacitors with a time between samples of about 3 microseconds, in equivalent time five orders of magnitude slower.

The anti-aliasing filter on the input to the signal line in the tapped transmission line of sampler 23 may be used to eliminate aliasing effects, or in the time domain, sampling jitter. A suitable filter characteristic would have a maximally flat pass-band with stop-band zeroes. The response of the anti-aliasing filter should show no overshoot or ringing, and should reject alias components by greater than 40 dB. Computer simulations and tests show that a fifth order maximally-flat filter with a Chebychev stop-band can be used. If the rise time of such filter is set to two sample intervals, it becomes essentially impossible to tell that sampling has occurred within the digitizer, upon effective reconstruction of the signal. The anti-aliasing filter, in a preferred system for reconstruction of the signal, has a sample rise time of approximately 2 samples lengths or 60 picoseconds.

As mentioned above, multiple samples of the signal are stored on the charge holding capacitors and sequentially scanned out for reading. Without a sample reconstruction filter 27, the output would resemble a bar graph as illustrated at line 26. By placing a smoothing filter 27 in the output path, the signal may be adequately reconstructed provided the filter (which may be passive linear, active linear, or digital) has an order of 3 or above and a flat phase characteristic. In one reduction to practice, a passive fifth order maximally-flat filter with a Chebychev stop-band was used.

Prior Art Samplers

Figure 3:
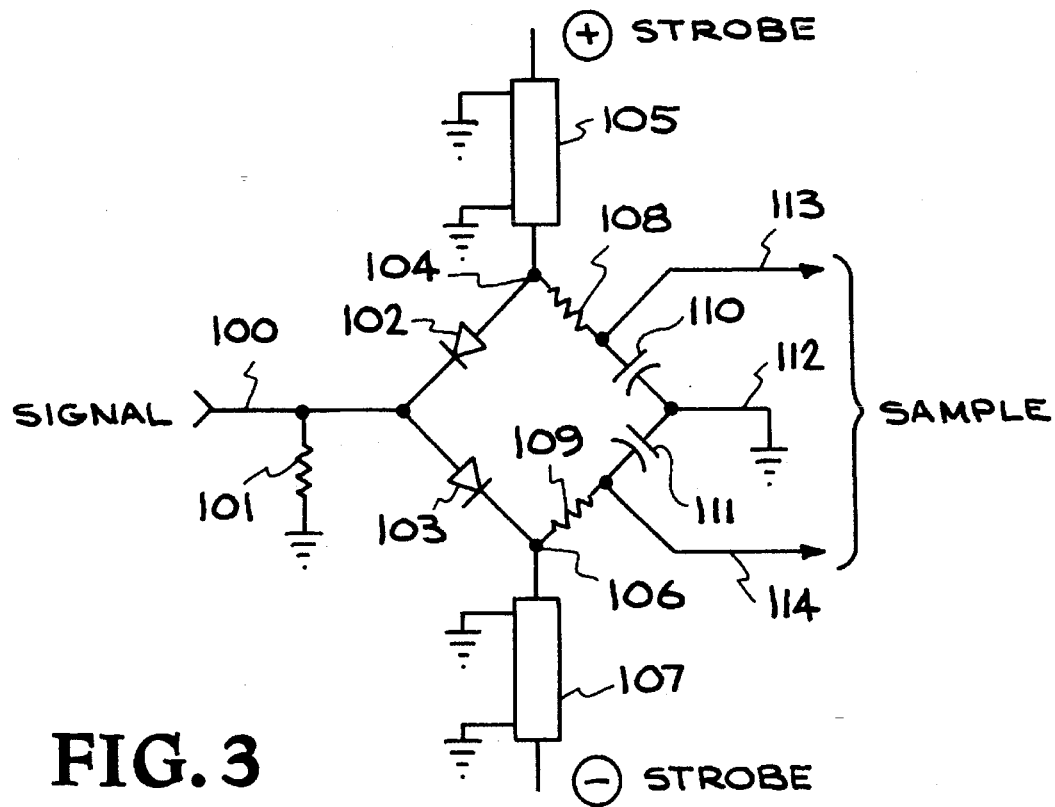
FIGS. 3 and 4 illustrate prior art sampling gate circuits.
Figure 4:
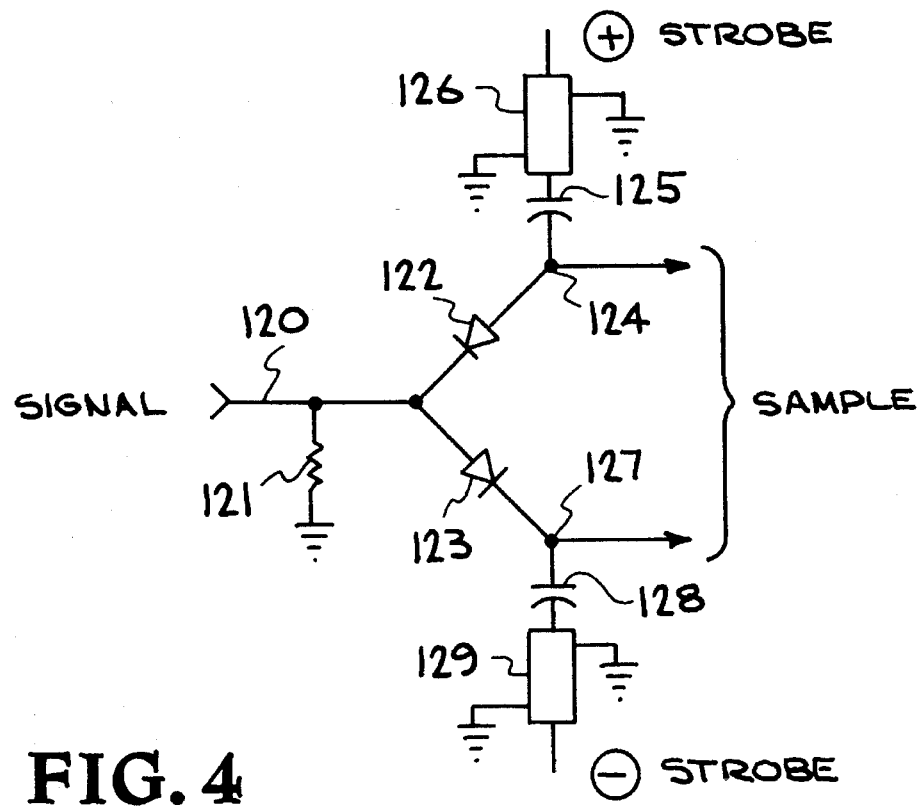

FIGS. 3 and 4 illustrate prior art samplers, limitations of which have prevented their practical application of tapped transmission lines for high speed sampling of signals.

The embodiment of FIG. 3 receives a signal input on line 100. A terminating resistor 101 is coupled to the input. The input is coupled to the cathode of a first diode 102 and the anode of a second diode 103. The anode of the first diode 102 is coupled to a strobe input 104 which receives a strobe across transmission line 105. The cathode of diode 103 is coupled to a negative strobe input 106 which receives a strobe across transmission line 107. The strobe inputs 104 and 106 are coupled across respective resistors 108 and 109 to nodes 113 and 114, respectively, and from nodes 113 and 114 across respective charge holding capacitors 110 and 111 to ground 112. The sample is taken across nodes 113 and 114.

In FIG. 4, the input is supplied on line 120 to which a terminating resistor 121 is connected. The input 120 is coupled to the cathode of a first diode 122 and the anode of a second diode 123. The anode of diode 122 is coupled to node 124 which is connected across charge holding capacitor 125 to a strobe transmission line 126 for the positive strobe pulse. The cathode of diode 123 is connected to node 127 which is connected across charge holding capacitor 128 to a negative strobe transmission line 129. The sample is taken across nodes 124 and 127.

These prior art samplers, based on two diode structures have the problem that when the diodes are not conducting, i.e., are not being strobed, the parasitic capacitance of the diodes form capacitive dividers between the input and the charge holding capacitors $C_h$. (The transfer function of the capacitive divider is $V_{OUT}=V_{IN}*C_d/(C_d+C_h)$, where $c_d$ is the diode capacitance, and $V_{OUT}$ is the "blow-by" voltage on $c_h$.) This capacitive divider allows "blow by" of the input signal to the output on the order of 5%. Since typically sampling efficiencies are also about 5%, the non-sampled blow by can be as strong as the sampled signal. Thus, these prior art samplers require precisely adjusted subtraction circuits to cancel out blow by. For the tapped transmission line implementation, having large numbers of samplers, it is difficult to tune each of the samplers. Thus, commercial application of tapped transmission lines using these samplers has not been practical.

Other prior art samplers are described in Grove, "Sampling for Oscilloscopes and other RF Systems: DC Through X-Band", IEEE TRANSACTIONS ON MICROWAVE THEORY AND TECHNIQUES, Vol. MTT-14, No. 12, Dec. 1966, pp. 629–635; and Miura, et al., "Monolithic Sampling Head IC", IEEE TRANSACTIONS ON MICROWAVE THEORY AND TECHNIQUES, Vol. MTT-38, No. 12, Dec. 1990, pp. 1980–1985.

Sampler Design

Figure 5:
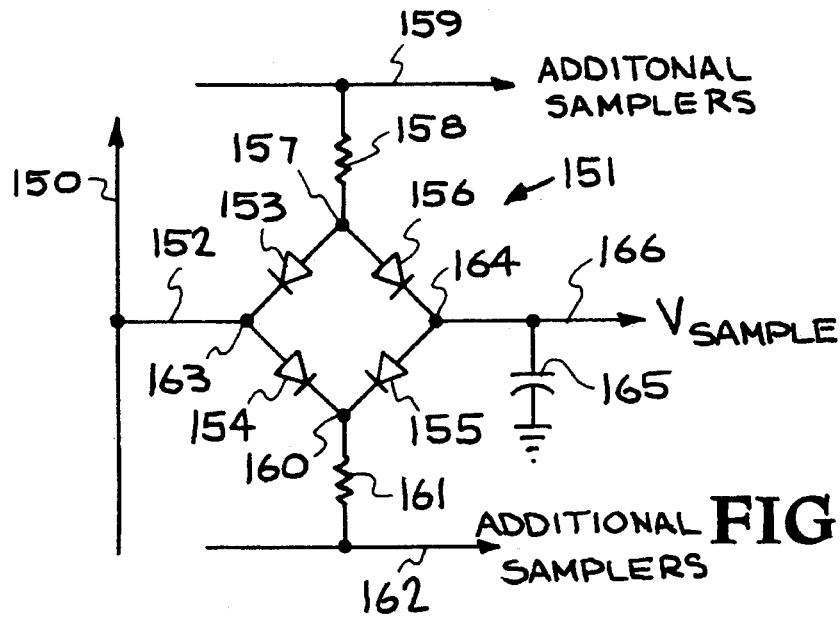
FIG. 5 is a schematic diagram of a high impedance four diode sampling gate based on a four terminal diode bridge according to the present invention.

FIG. 5 illustrates the basic sampler according to the present invention having four diodes with high impedance strobe inputs. In the embodiment of FIG. 5, the input signal is supplied along transmission line 150. A sampler, generally 151, is connected to the transmission line 150 at tap 152. Tap 152 is connected to a diode bridge sampler which includes four diodes 153, 154, 155, and 156 configured in a bridge having four terminals. Other diode bridge embodiments may include series or parallel combinations of diodes, resulting in more than four diodes in the four terminal diode bridge. The first terminal 157 of the bridge is connected across a resistor 158 to a positive strobe transmission line 159. The third terminal 160 is coupled across a negative strobe resistor 161 to a negative strobe transmission line 162. The strobe transmission line 159 supplies a positive pulse while the strobe transmission line 162 supplies a negative pulse.

The second terminal 163 of the bridge is connected to line 152 to receive the input signal. The fourth terminal 164 of the bridge is connected to the charge holding capacitance 165. The charge holding capacitance 165 supplies the sample signal on line 166.

The four diode bridge of FIG. 5 solves the blow by problem since the two diodes on the input side of the four diode bridge look into the strobe resistors 158, 161, forming a transmission zero at low frequencies and preventing any permanent charge from transferring to the charge holding capacitance 165. Short transients are coupled through the diodes, but as long as their duration is much shorter than the read out circuitry following the charge holding capacitance 165, the transients are averaged to zero.

Furthermore, the high resistance strobe resistors 158 and 161 provide a significant feature. High resistance here is defined as much higher than the signal transmission line impedance. As the resistance approaches a high value, the net loading of diodes 153–156 on the transmission line approaches that of one diode. This can be seen by the fact that the sampler appears as two parallel strings of two diodes in series, which is equivalent to one diode. In the systems of FIGS. 3 and 4, the loading would be two diodes. This allows a significantly greater number of samplers to be placed on a single transmission line.

Furthermore, the high value strobe resistors permit many samplers to be fed from a single strobe generator. Both of the prior art circuits of FIGS. 3 and 4 present a relatively low impedance at the strobe inputs, making operation with a large number of samplers impractical. Furthermore, the four diode bridge of FIG. 5 presents its output at the same DC level as the input signal. The prior art circuit in FIG. 3 required a DC level shift with relatively high value resistors in the signal path resulting in noisy performance. Also, the prior art circuit of FIG. 4 must be level shifted with subsequent high impedance circuitry.

An alternative four terminal diode bridge configuration includes two series diodes per leg of the bridge with a clamp diode on each of the strobe inputs (ten total diodes). Simulations indicate that this ten diode sample gate may have better performance characteristics due to lower tap losses.

Figure 6:
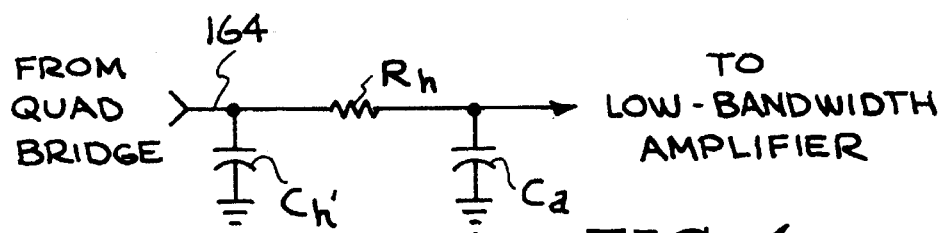
FIG. 6 illustrates a charge holding capacitor configuration for use with the sampling gates of FIG. 5 according to the present invention.

FIG. 6 illustrates the charge holding capacitance network of a preferred embodiment of the present invention for use with the four diode bridge of FIG. 5. In this embodiment, the charge holding capacitance 165 is replaced with a first capacitor $C_{h'}$ and a second capacitor $C_a$ isolated from the first capacitor $C_{h'}$ by a resistor $R_h$. The input to the charge holding capacitance network of FIG. 6 would be node 164 of FIG. 5. Thus, the charge holding capacitance is implemented with a relatively smaller capacitor $C_{h'}$ and a relatively larger capacitor $C_a$, isolated by a resistor $R_h$. $C_{h'}$ is made small to allow rapid charging during the sampling aperture, allowing full signal acquisition and preventing slew-rate limitations that would occur with a larger capacitor. The relatively larger capacitor $C_{a'}$ is decoupled from the relatively smaller capacitor $C_{h'}$ during the sampling aperture by the use of the resistor $R_h$. After the short sampling aperture occurs, charge on the capacitance $C_{h'}$ transfers to the capacitance $C_{a'}$ at a much slower rate. The net voltage is diminished by about $C_h/C_a$ but the bandwidth of the amplifier may be reduced so that the net dynamic range tends to remain constant. The resistance $R_h$ also isolates fast transitions on $C_{h'}$ and allows the amplifier to be located at some distance from $C_{h'}$.

In practice, as described below with respect to FIGS. 8A and 8B, the capacitance $C_a$ may be provided by the input capacitance to a voltage buffer amplifier connected to the capacitance $C_{h'}$ through an isolating resistor $R_h$.

Figure 7:
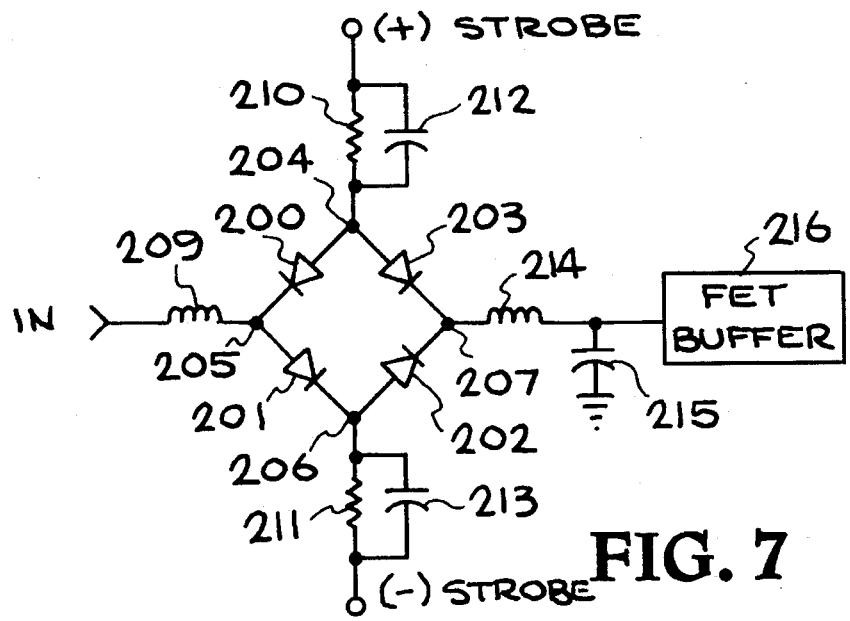
FIG. 7 is a schematic diagram of an inductively compensated high impedance sampling gate according to the present invention.

FIG. 7 illustrates an inductively compensated sampler according to the present invention which reduces the settling error for high speed samplers over that described with respect to FIG. 5.

As in FIG. 5, the circuit is based on a four diode bridge including diodes 200, 201, 202, 203 configured in a four terminal bridge, having terminals 204, 205, 206, 207. The input signal is supplied at terminal 205 through inductor 209. Strobe signals are supplied to terminals 204 and 206, respectively, through respective resistors 210 and 211. These resistors 210 and 211 have a small parasitic capacitance 212 and 213 illustrated in the figure.

The output of the bridge is supplied at terminal 207 through inductor 214 to the charge holding capacitor 215.

The inductances 209 and 214 are added to inductively compensate the sampling circuit to reduce the settling error of the system. The values can be tuned for a specific application. For one preferred system, the values of the various components were selected as indicated in the figure, for a system operating with a strobe pulse width on the order of 70 picoseconds for an effective sampling aperture of about 50 picoseconds.

These small values of inductance can be added to the circuit with careful layout of the connections between the various components, or otherwise provided, as known in the art.

As illustrated in FIG. 7, the sample charge holding capacitor 215 is coupled to an FET output buffer 216 and may be configured with the capacitor network shown in FIG. 6.

32 Channel Sampler

FIGS. 8A, 8B, 9A, 9B, 10, 11, and 12 illustrate one implementation of a 32 channel sampler according to the present invention. FIGS. 8A, 8B, 9A, and 9B are a schematic diagram. FIGS. 10, 11, and 12 illustrate a physical layout and characteristics of transmission line and strobe line of the present invention.

Figure 8A:
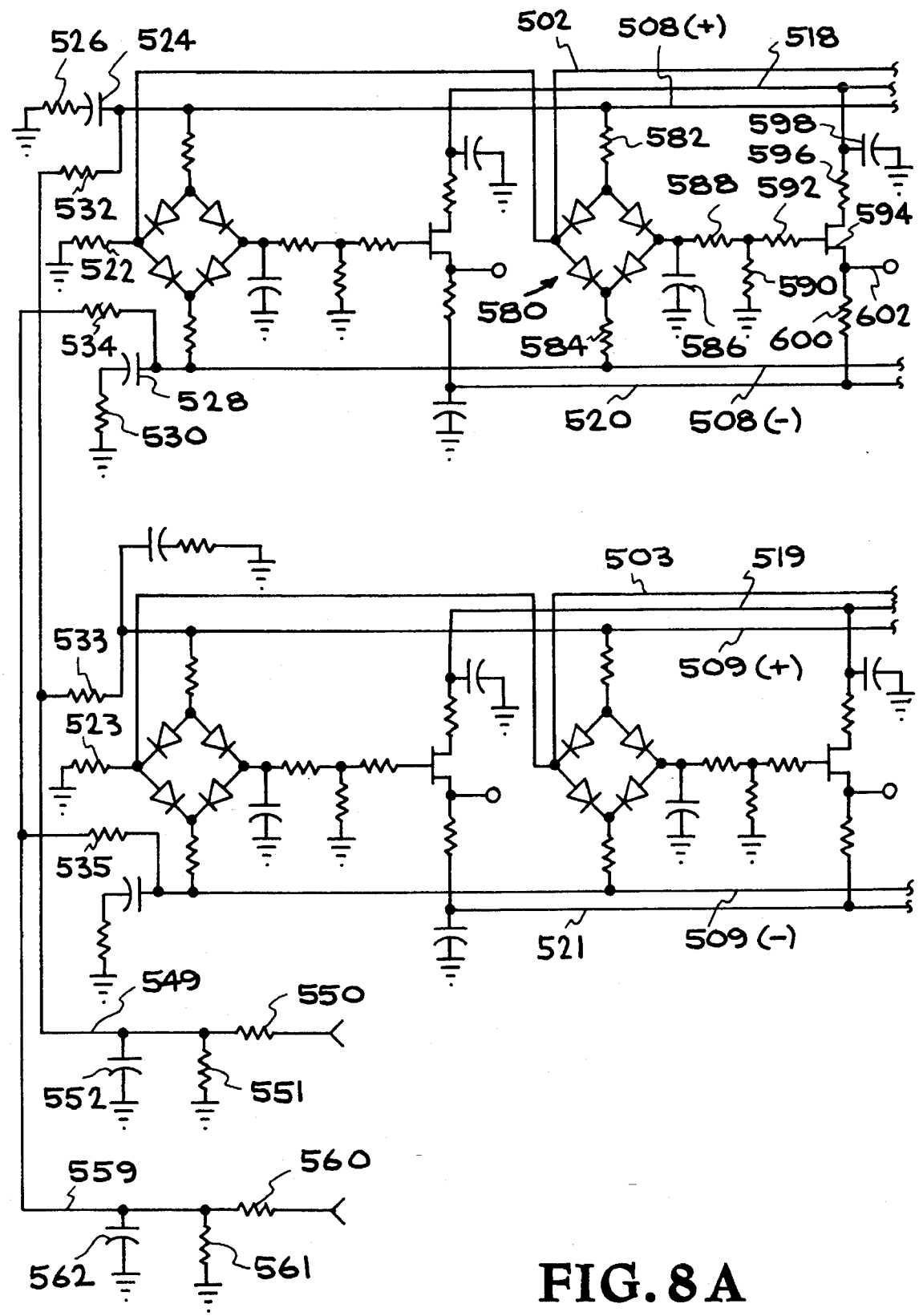
FIGS. 8A and 8B together provide a schematic diagram of a tapped transmission line with sampling gates according to the present invention.
Figure 8B:
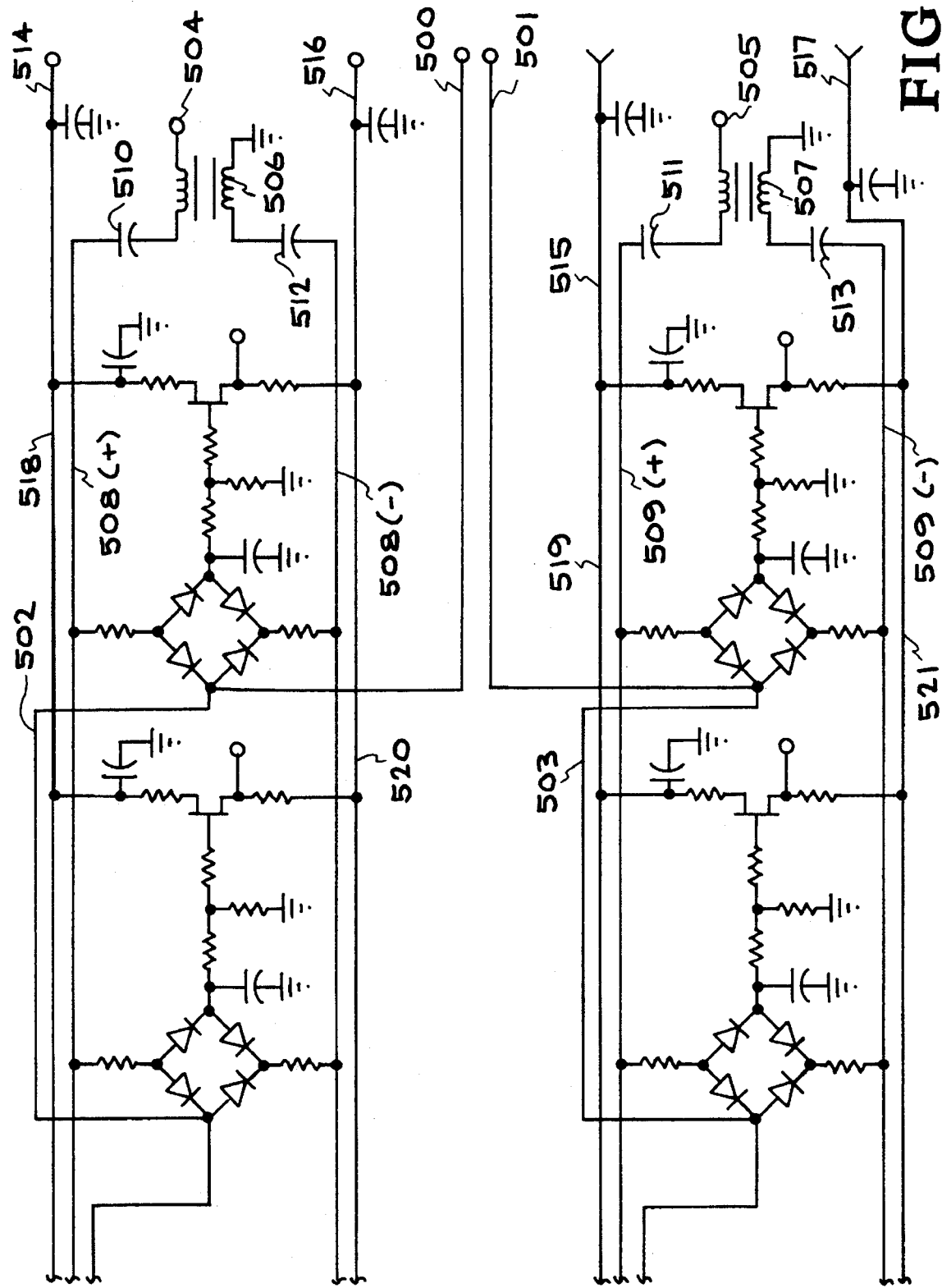

With 8A and 8B placed side by side, with FIG. 8B on the right, the sampling gates of a 32 channel sampler are illustrated.

As shown in FIG. 8B, the circuit includes a first RF sample input 500 and a second RF sample input 501. The first sample input 500 is coupled to a transmission line 502 which meanders through each of a first bank of high impedance four diode samplers including even numbered channels 0, 2, . . . , 30. The second input 501 is coupled to transmission line 503 which meanders through the samplers of the odd numbered channels 1, 3, . . . , 31. Similarly, as shown in FIG. 8B, there is a first strobe input 504 and a second strobe input 505. The strobe inputs 504 and 505 are supplied through respective RF transformers or baluns 506, 507 and through capacitors 510, 511, 512, and 513 to balanced positive and negative strobe lines 508+, 508–, and 509+, 509–, respectively. Also shown in FIG. 8B are the inputs of power supplies for +V 514, 515 and –5 V 516 and 517 for the even and odd sides, respectively. The +V input 514 is distributed on line 518 on the even side and 519 on the odd side. Similarly, the –5 V inputs on lines 516 and 517 are distributed on lines 520 and 521 on the even and odd sides, respectively. Decoupling capacitors connected to line 518, 519, 520, and 521 are shown in the figure.

As shown in FIG. 8A, the transmission line 502 for the input sample is terminated through resistor 522 on the even side and transmission line 503 is terminated through resistor 523 on the odd side.

The positive and negative strobe lines are also similarly terminated through capacitor 524 and resistor 526 for positive strobe line 508 and capacitor 528 and resistor 530 for negative strobe line 508–. Positive strobe line 508+ is also coupled across resistor 532, line 549 and resistor 550 to the –5 V supply with resistor 551 and capacitor 552 coupled to ground from line 549. The positive strobe line 509 + on the odd side is similarly terminated and connected through resistor 533 to line 549.

The negative strobe line 508– on the even side is coupled through resistance 534 to line 559. Similarly, negative strobe line 509– is coupled to resistance 535 to line 559. Line 559 is connected through resistor 560 to the +V supply with resistor 561 and capacitor 562 coupled to ground from line 559.

The samplers are identical for each of the 32 channels. The sampler in channel 2 is representative. As can be seen in channel 2, the sampler includes a four diode bridge 580 having first, second, third, and fourth terminals. The first terminal is connected across resistor 582 to the positive strobe line 508+. The second terminal is connected to transmission line 502 for the sample input. The third terminal is connected across resistor 584 to the negative strobe line 508–. The fourth terminal is connected to a charge holding capacitor 586 and also across resistor 588 to a buffer driver. The input to the buffer driver includes a resistor 590 to ground and a resistor 592 to the gate of FET transistor 594. The FET transistor 594 is connected in a source follower configuration having its drain connected through resistor 596 to the positive power supply line 518. Also, capacitance 598 is coupled from the power supply line 518 to ground. The source of FET 594 is connected through resistor 600 to the negative power supply line 520. Also, the source supplies the output signal on line 602 to the scanning circuit shown in FIGS. 9A and 9B.

The values for the various components illustrated in the figure are representative of a specific embodiment and may vary depending on the characteristics of a specific implementation. The FET chosen for the implementation shown in FIGS. 8A and 8B is an NE72084. The capacitance 586 is a butterfly pad capacitance of about 0.3 picofarads. The charge holding capacitance network includes the input capacitance of the FET 594 and operates as described above with respect to FIG. 6. The gate capacitance of FET 594 is about 3 to 10 times greater than the capacitance 586, in a preferred embodiment.

Figure 9A:
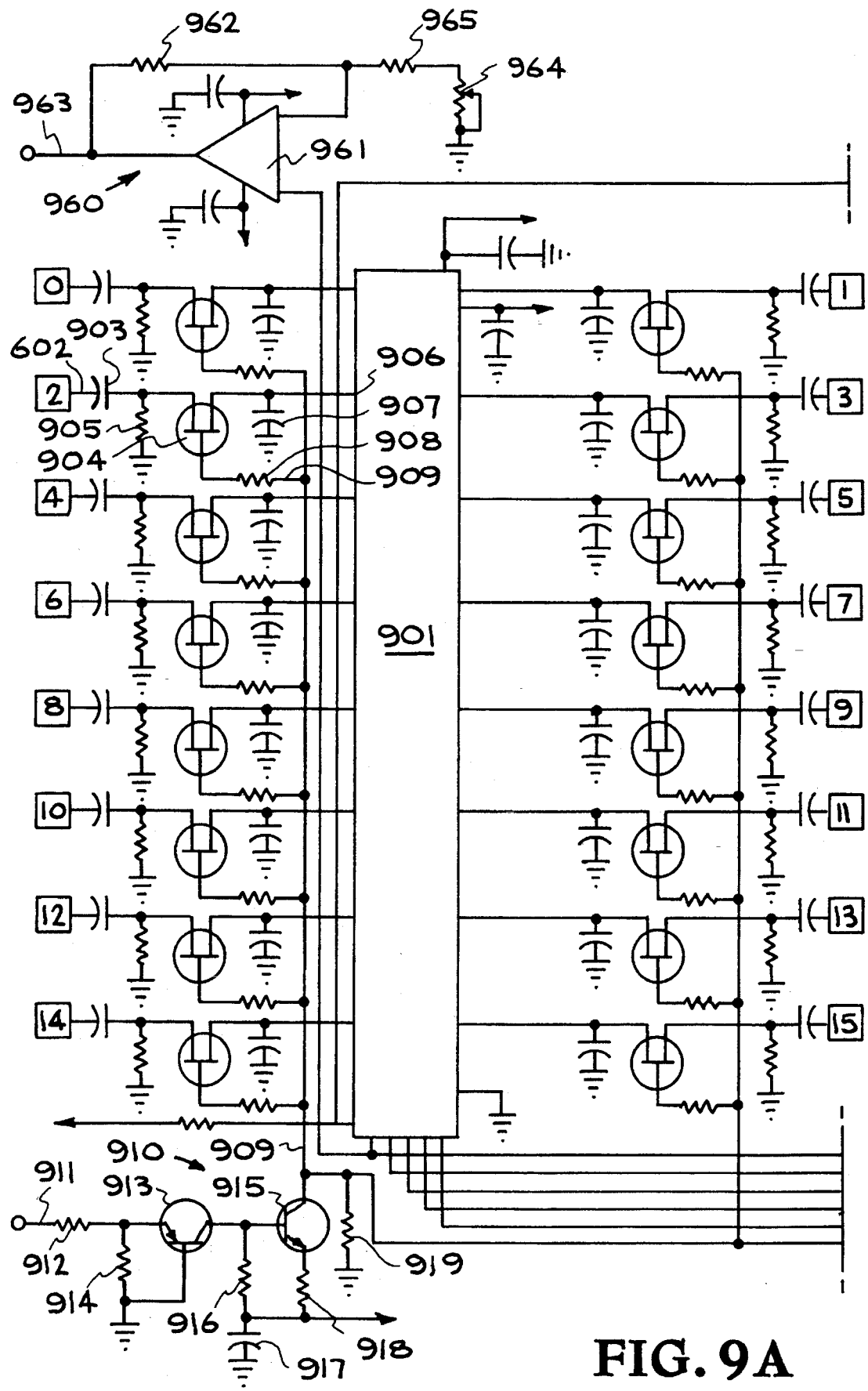
FIGS. 9A and 9B together provide a schematic diagram of the scanout circuit for the tapped transmission line of FIGS. 8A and 8B.
Figure 9:
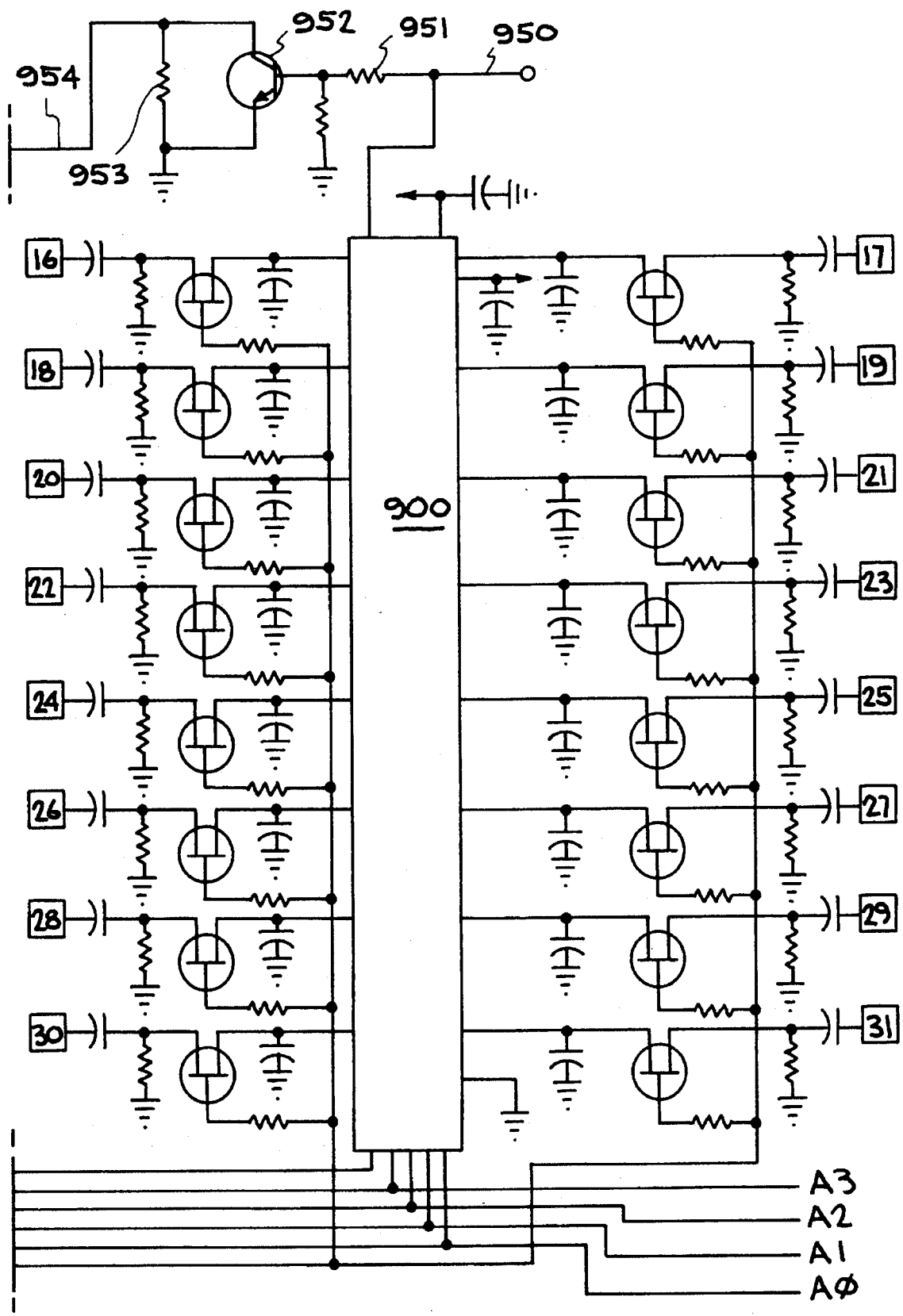

The outputs of each of the channels is supplied on the terminals labelled 0 through 31 in FIGS. 8A and 8B to the scan circuit of FIGS. 9A and 9B. Thus, FIGS. 9A and 9B, with FIG. 9B on the right, illustrate a 32:1 scanner scanning out the values of the charge holding capacitors in the samplers in FIGS. 8A and 8B. Each of the 32 channel inputs is identical, with 16 being supplied to 16:1 multiplexer 900 (ADG506AKP) in FIG. 9B and 16 supplied to 16:1 multiplexer 901 (ADG506AKP) in FIG. 9A. Note that the outputs from the even numbered channels 0 through 14 and from the odd numbered channels 1 through 15 are coupled to multiplexer 901, while the outputs from the even numbered channels 16 through 30 and the outputs from the odd numbered channels 17 through 31 are coupled to multiplexer 900. This allows interleaving of the outputs of the two banks, as described in more detail below.

Each of the inputs is substantially identical, with input of channel 2 being representative. Thus, the input to the scanner receives the output of the FET buffer on line 602 as input. This line 602 is coupled through a decoupling capacitor 903 to the source of pass gate 904. A resistor 905 is coupled from the source of pass gate 904 to ground. The drain of the pass gate 904 is connected to an input 906 of the multiplexer 901 and to a sample hold capacitor 907. This sample hold capacitor 907 is about 0.001 microfarads, substantially greater than the charge holding capacitance in the samplers.

The gate of the pass gate transistor 904 is coupled through resistor 908 to line 909. Line 909 is driven by the level translation circuit 910 which receives a track/hold T/H signal 911 as input. The T/H signal 911 is supplied through resistor 912 to the emitter of transistor 913. The base of transistor 913 is coupled to digital ground and the emitter is also coupled through resistor 914 to digital ground. The collector of transistor 913 is connected to the base of transistor 915 and across resistor 916 to a –15 V power supply. Similarly, the emitter of transistor 915 is coupled across resistor 918 to a –15 V power supply. Capacitance 917 is coupled between the –15 V power supply to ground. The collector of transistor 915 drives line 909 with the track/hold signal. Line 909 is also connected across resistor 919 to analog ground. The level translation circuit 910 for driving the T/H signal from line 911 may be replaced in a preferred system with a circuit that is not sensitive to the voltage of the input on line 911 to drive the pass gates (e.g., pass gate 904 of channel 2).

As can be seen, all 32 inputs to the scanner are driven by the same T/H signal on line 911. This signal normally holds the pass gates, e.g., pass gate 904 on channel 2, open. A short interval (200 nanoseconds after the trigger in one implementation) after the strobe of the sampler, the pass gates are all simultaneously closed. Thus, voltage is transferred from the charge holding capacitance in the sampling gates onto the larger sample hold capacitor at the input of the multiplexers, e.g., capacitor 907 in channel 2, and is held until it may be sampled sequentially through the multiplexers.

The multiplexers are controlled by address lines A0 through A3 and enable line 950. Enable line 950 is coupled through resistor 951 to the base of transistor 952. The collector of transistor 952 is coupled to the input on line 954 of the multiplexers 901 and 900 and across resistor 953 to ground. The emitter of transistor 952 is connected to ground.

By driving the address lines and the enable signal on line 950, the outputs of the multiplexers are supplied to low output impedance buffer, generally 960, shown in FIG. 9A. The buffer 960 includes op-amp 961 which receives the output of the multiplexers 900 and 901 in a wired OR configuration at the positive input. The negative input is supplied to an adjustable gain feedback network, including resistor 962 between the negative input and the output 963 of the opoamp 961. Also, the negative input is coupled to resistor 965 and adjustable resistor 964 for adjusting the gain of the buffer 960. The output on line 963 supplies the analog output of each sample as it is read from the sample holding capacitors (e.g. capacitor 907 in channel 2). This analog output may be supplied to any of a variety of destinations, including a digitizer or a sample reconstruction filter.

In a preferred system, the schematic shown in FIGS. 8A, 8B, 9A, and 9B are implemented in a multi-level circuit board. The top layer of the circuit board carries the signal transmission lines (e.g. lines 502, 503 of FIGS. 8A–8B), the middle layer of the circuit board carries a ground plane, and the bottom layer of the circuit board carries the balanced positive and negative strobe transmission lines (e.g. lines 508+, 508–, 509+, 509– of FIGS. 8A–8B). The circuit board is implemented in one embodiment with two layers of 0.010 inch thick woven teflon with 0.010 inch diameter copper filled vias available through Rogers Corp., of Chandler, Ariz. The circuit board is clad with ½ ounce copper, and the signal transmission lines, 502 and 503, are 30 mils wide.

In FIG. 10, a top surface metal of a circuit board carrying the two banks of samplers shown in FIGS. 8A and 8B is illustrated. FIG. 11 shows the bottom surface metal. The strobe and signal lines are isolated to prevent unwanted crosstalk by placing a signal line on the top surface, using a middle ground plane between the teflon layers for isolation and placing the strobe line on the bottom surface, as shown in FIGS. 10 and 11, respectively. The top layer in FIG. 10 includes transmission line 502 and transmission line 503 for the input samples. As can be seen, the transmission line 502 meanders (i.e., is not straight) to a terminating point 570, tracing a U-shaped path with a semi-circular portion (e.g., 680) having a radius of 0.125 inches and two straight side segments (e.g., 681,682) having a length of 0.175 inches, continuous with corresponding straight side segments (e.g., 683, 684) on adjacent U-shaped paths. Similarly, the transmission line 503 meanders to a terminating point 571. The meander pattern may vary as suits the needs of a particular application.

At a plurality of positions along the transmission line, a corresponding plurality of sample gates are connected, e.g., gates in region 572 and in region 573 on the even and odd banks, respectively. There are 16 samplers per bank 502, 503 of the transmission lines. More details concerning the layout of the samplers is illustrated with respect to FIG. 12.

A planar balun is depicted in FIGS. 10 and 11 consisting of a top layer microstrip launch 554 tapering to a parallel plate line which is then coupled to a balanced pair of bottom layer microstrips. No ground plane separates the top and bottom balun layers. A single unipolar pulse applied to the top layer microstrip results in a matched pair of bipolar pulses on the bottom microstrips with a transfer efficiency of about 90%. The top launch 554 is coupled by via 558 to a positive strobe line 574. The bottom launch 556 is coupled to the negative strobe line 575. These positive and negative strobe lines 574 and 575 correspond to strobe lines 508+ and 508−, respectively, from FIGS. 8A and 8B. The odd half lines are similarly connected.

The balanced positive and negative strobe lines 574 and 575 are microstrips having stepped impedance. At each position, e.g., position 554+, 554−, the impedance of the strobe line is stepped by reducing the width of the microstrip to maintain the amplitude of the strobe signal down the line. In order to maintain constant strobe amplitude along the strobe distribution line, the impedance $Z_N$, of the strobe line is stepped at each tap in according to the formula $Z_N+1 = Z_N/(1-Z_N/R_{STB})$, where $R_{STB}$ is the value of resistor 158 or 161 of FIG. 5. In the embodiment of FIG. 11, the strobe line impedance is tapered from 50 Ohms to 75 Ohms across 16 taps, and the strobe line microstrip widths taper from 30 mils to 15 mils.

As can be seen, the transmission line 503 meanders between the gates, while the strobe lines 574, 575 are substantially straight between the positions of the samplers. This results in a propagation time between sample gates along the input transmission line 503 longer than the propagation time for the strobe along the strobe lines 574, 575. The time difference between the meandering line and the straight line defines the tap spacing in time. This allows a single strobe to be propagated to a number of samplers along a single line pair.

The samplers illustrated in FIGS. 10–12 are configured for co-propagating strobe in which the strobe and signal lines are supplied to the same end of the board and propagate in the same direction. This overcomes the very high strobe voltage requirements of a broadside arrangement as depicted schematically in FIG. 1, which would fan out a single strobe input across independent lines to each of the samplers. Also, counter-propagating strobe arrangements present design difficulties.

FIG. 12 is a blow up of the top layer of one portion of the sampler including four sample gates. In FIG. 12, the transmission line 503 is shown meandering among four identical sample gates. One representative sample gate is given reference numeral 660. It includes a four diode bridge 661 (such as available from Metelics Corporation, Sunnyvale, Calif., "Bridge Quad") having a first input coupled to tap 662 on the transmission line.

Since the sampling bridge presents a capacitive load to the signal line, it can be compensated by locally increasing the impedance of the signal line. In a planar layout, such as shown in FIGS. 10–12, with a microstrip transmission line, a notched or reduced width section 663 is located each tap.

The first input to the bridge 661 is connected to a resistor 664 which is coupled to the strobe line through via 665. Similarly, the third input to the bridge 661 is connected to resistor 666 which is coupled to the negative strobe line through via 667. The fourth input 668 of the bridge is coupled to a butterfly capacitor 669 which provides a charge holding capacitance for the network. This capacitance is coupled through a 10K resistor 670 to microstrip 671. The connector 671 is also connected to a resistor 690 to via 691, which is connected to ground. Via 672 connects connector 671 to segment 673 underneath the transmission line on the third layer of the circuit board. Segment 673 is physically on the third layer as labelled on FIG. 11.

Segment 673 is coupled through via 674 to 2K resistor 675. This resistor is coupled to the gate of FET 676. The drain of FET 676 is connected through resistor 677 to capacitor 678, which is coupled to the common, or ground, terminal 679. The source of FET 676 is connected to the output pad 680 and across resistor 681 to via 682, which is connected to the power supply.

As can be seen, the components in the layout shown in FIG. 12 correspond to the components of a sampler as shown in FIGS. 8A and 8B.

Strobe Generation

FIGS. 13 and 14 illustrate alternative methods for generating a strobe in the 20–25 V range having a width of less than 70 picoseconds. The first implementation of FIG. 13 is a cascaded step recovery diode circuit. The circuit includes an input 1000 which is connected across resistor 1001 to the base of bipolar transistor 1002. A resistor 1003 is connected from the input 1000 to ground. The cathode of diode 1004 is connected to the base of transistor 1002 and the anode of diode 1004 is connected to ground. The emitter of transistor 1002 is connected to ground.

The collector of transistor 1002 is connected across resistor 1005 to a positive 20 V power supply 1006. Also, the collector of transistor 1002 is connected to the gate of FET transistor 1007. Transistor 1007 is a P-channel MOS transistor having its source connected to the power supply 1006 and its drain connected to terminal 1008. Also, a capacitor 1009 is connected between the power supply 1006 and ground.

Terminal 1008 is connected across resistor 1010 to a minus 5 V power supply 1011. Also, a capacitor 1012 is connected from the minus 5 V power supply 1011 to ground.

Terminal 1008 is also connected at the gate of N-channel MOS transistor 1013. The source of transistor 1013 is connected to ground. The drain of transistor 1013 is connected to node 1014. Node 1014 is connected across resistor 1015 to a positive 60 V power supply 1016. The power supply 1016 is coupled across capacitor 1017 to ground. Node 1014 is also coupled through capacitor 1018 and inductor 1019 to node 1020.

At node 1020, the anode of step recovery diode 1021 is connected. The cathode of step recovery diode 1021 is connected to ground. Node 1020 is also connected through parallel resistors 1022 to the positive 20 V power supply 1006.

Node 1020 is connected across resistor 1023 and capacitor 1024 to node 1025. Node 1025 is connected to the anode of step recovery diode 1026. The cathode of diode 1026 is connected to ground. Node 1025 is also connected through series resistors 1027 and adjustable resistor 1028 to the positive 20 V power supply 1006.

Finally, node 1025 is connected through capacitor 1029 to output node 1030. The output node 1030 also has an inductance 1031 connected to ground.

On switching the input 1000, the transitions generate a drive current at node 1014 with an approximately 1 nanosecond fall time. The first diode 1021 switches more slowly but with higher amplitude than the second diode, 1026. The second diode 1026 is very fast and has a short recovery time. Therefore, it requires a very fast drive. The fast drive is provided by the diode 1021 through capacitance 1024 and resistor 1023. During the drive phase, the diode 1021, capacitor 1024, and resistor 1023 isolate diode 1026. Diode 1021 hogs the drive current from diode 1026 until diode 1021 recovers from forward bias, or "snaps" off with an approximately 250 picosecond fall time. When this occurs, the diode 1026 receives a very fast drive transition. This circuit provides very fast transitions several times higher in amplitude than commercially available (non-avalanche) pulse generators. With the cascaded device, the voltage at node 1025 has a very short fall time. This is supplied to a differentiator, capacitor 1029 and inductor 1031, which produces a 20–25 V pulse, having a very short pulse width on the order of 60–70 picoseconds, and an effective sampling width on the sampler of FIG. 5 of about 30 to 50 picoseconds.

FIG. 14 illustrates an alternative embodiment for driving a high amplitude short pulse width strobe. It comprises a multi-stage shock line where each stage includes a series inductance and a diode to ground. Thus, first stage includes inductor 1100 and diode 1200, second stage includes inductor 1101 and diode 1201, the third stage includes inductor 1102 and diode 1202, the fourth stage includes inductor 1103 and diode 1203, the fifth stage includes inductor 1104 and diode 1204, the sixth stage includes inductor 1105 and diode 1205, the seventh stage includes inductor 1106 and diode 1206 in series with diode 1207 to ground, the eighth stage includes inductor 1107 and diode 1208 in series with diode 1209 to ground. The output of the shock line is supplied through inductor 1109 with a pulldown inductor 1110 coupled from the output of the eighth stage to ground.

The first four inductors 1100 through 1103 have a value of about 4.5 nanoHenrys. The second four inductors 1104 through 1107 have a value of about 2.2 nanoHenrys. The output inductor 1109 has a value of about 1.0 nanoHenry, while the pulldown inductor 1100 has a value of about 1.6 nanoHenrys.

Each of the diodes is a 65 V silicon hyperabrupt veractor available through M-pulse Microwave Corp., in San Jose, Calif. The shock line illustrated in FIG. 14 creates an impulse which is very clean with an amplitude of approximately 30 V at a pulse width of approximately 68 picoseconds.

Using the impulse generators of FIGS. 13 or 14 allows driving the samplers of the present invention with an impulse of greater than 20 V with a very short aperture. This allows very high sampling rates achieved by the present invention.

Multiple Banks Embodiment

As illustrated in FIG. 15, a plurality of banks of samplers 1500-0 through 1500-N are configured in parallel. In the example described above, the tapped transmission line structure is broken down into two banks of 16 samplers each. The outputs of the samplers are interleaved in the multiplexer. Timing the strobe pulse to each of the banks independently allows interleaving of the samples to achieve a smaller sample spacing.

An input signal in the generalized multibank system of FIG. 15, is supplied on line 1501 to each of the sampler banks in parallel. The 16 outputs of each sampler banks are supplied on lines 1502-0 through 1502-N to a scanout circuit 1503. The time between samples is determined by the difference in propagation time between the meandering input signal line and the straight strobe lines which, in the system of FIGS. 10–12, is approximately 60 picoseconds. By controlling the timing of the strobe inputs to each of the plurality of samplers using a strobe control circuit 1504, these signals may be either concatenated or interleaved to achieve a desired output effect. Thus, an input impulse generator 1505 is included for generating the strobe pulses supplied to a strobe control circuit 1504. The strobe control circuit 1504 will have a selectable delay to each of the banks of samplers. Thus, the strobe at sample bank 1502-0 may be supplied at time zero. The strobe at sample bank 1502-1 may be supplied at time $\Delta T/2$ (30 picosecond delay for a 60 picosecond time between samples) so that the net sampling rate of the outputs of samplers 1500-0 and 1500-1 is $\Delta T/2$, where $\Delta T$ is the sample spacing in time of each bank.

Alternatively, the strobe may be delayed by $\Delta T/N$ where N is the number of sample banks for net sample spacing of $\Delta T/N$. As can be seen, you get very short sampling intervals by interleaving a large number of sample banks with controlled strobe timing. This controlled strobe timing may be achieved with trimmed transmission lines for precise delays, and switches to select specific transmission lines for specific samplers.

To achieve a concatenated effect for very long sample lengths, the strobe control circuit 1504 may delay the strobe to each sampler by an amount T equal to $\Delta T$ times the number of sample gates per sampler. In this way, when a first bank of samplers 1500-0 completes sampling 16 $\Delta T$ intervals, the second bank of samplers 1500-1 is strobed in a timed relationship so that the first gate of bank 1500-1 generates a sample for the seventeenth $\Delta T$ interval from the input time. In this way, the samplers may be concatenated a large number of times to generate a very long sample length.

Enhancements

This system may be modified with a variety of enhancements including non-uniform tap spacing, non-uniform tap weighting, coherent sample integration, monolithic embodiment, block concatenation, auto calibration, continuous conversion, and others.

The transient sampler is a generic instrument with an application range almost as wide as that of conventional oscilloscopes. The cost and size of existing commercial samplers has limited their widespread use. The present invention reduces both the cost and size by a factor of about 5 compared to CRT based digitizers, as described above in the background of the invention.

The samplers are particularly suited to recording single event, sub-nanosecond transients generated by laser systems. As the speed of electronic devices increases, the needs for high speed instrumentation grows. For example, GaAs digital logic devices operate at sub-nanosecond speeds and the testing of these devices is becoming increasingly difficult, especially in catching short glitches that must be screened out during manufacture.

The embodiments described above include sample gates at positions along the sample transmission line that are uniformly spaced. An alternative embodiment employs non-uniform spacing of sample gates, such as may be useful in signal processing applications or otherwise.

Emerging technologies, such as ultra-wide band radar, spread spectrum communications, and low probability of intercept radar and communications are hampered by the lack of low-cost available electronics. The present invention and enhancements to it will be the first devices specifically suited to time domain reception for such high speed effects.

Although the embodiment described shows two banks of 16 gate per bank samplers, a variety of configurations could be utilized including an eight bank system with 32 gates per bank, for a total of 256 samplers. The strobe rates achieved by the present invention with a 30 picosecond interleaving, as described with respect to FIGS. 11–12, achieves a sample rate of 33 Gigahertz. This greatly exceeds all prior art systems. The non-interleaved system has a time between samples of approximately 60 picoseconds, which is, again, much higher than any prior art systems. Sampling rates of less than 150 picoseconds between samples are critical to commercial implementation of high speed tapped transmission line samplers, and are easily made according to the present invention.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A high speed sampler, comprising:
   a sample transmission line for transmitting an input signal;
   a strobe transmission line including a conductive strip for transmitting a strobe signal; and
   sampler circuitry having a plurality of positions coupled with the conductive strip of the strobe transmission line and coupled with the sample transmission line, which samples the input signal at the plurality of positions in response to the strobe signal to supply a plurality of samples of the input signal, wherein the plurality of samples are spaced in time on the input signal by less than about 150 picoseconds;
   wherein the sampler circuitry includes a plurality of diode bridge sample gates having relatively high impedance strobe line inputs connected to the sample transmission line at each of the plurality of positions.

2. The high speed sampler of claim 1, wherein the plurality of samples are spaced in time on the input signal by less than about 30 picoseconds.

3. The high speed sampler of claim 1, wherein the plurality of positions are uniformly spaced along the sample transmission line.

4. The high speed sampler of claim 1, wherein the plurality of positions are non-uniformly spaced along the sample transmission line.

5. The high speed sampler of claim 1, wherein the strobe transmission line includes balanced positive and negative strobe lines, and the sample gates each include:
   a plurality of diodes configured as a four terminal bridge having first, second, third, and fourth terminals;
   a first strobe resistor connected to the first terminal of the bridge and to the positive strobe line;
   a second strobe resistor connected to the third terminal of the bridge and to the negative strobe line;
   a tap connected to the second terminal of the bridge and to the sample transmission line; and
   a sample holding capacitor connected to the fourth terminal of the bridge.

6. The high speed sampler of claim 5, wherein the resistance of the first strobe resistor and second strobe resistor are substantially higher than the impedance of the sample transmission line.

7. The high speed sampler of claim 1, wherein the sample transmission line comprises a conductive strip which meanders between the plurality of positions, and the strobe transmission line includes balanced positive and negative conductive strips which are essentially straight between the plurality of positions, so that propagation times between respective ones of the plurality of positions are longer for the input signal than for the strobe signal.

8. The high speed sampler of claim 1, wherein propagation times between respective ones of the plurality of positions are longer for the input signal on the sample transmission line than for the strobe signal on the strobe transmission line.

9. The high speed sampler of claim 1, further including means coupled with the sample transmission line for compensating for capacitive loading of the sampler circuitry at the plurality of positions.

10. The high speed sampler of claim 9, wherein the sample transmission line comprises a microstrip, and the means for compensating includes reduced-width sections of the microstrip at the plurality of positions.

11. The high speed sampler of claim 1, further including means coupled with the strobe transmission line for maintaining substantially constant strobe amplitude at the plurality of positions.

12. The high speed sampler of claim 11, wherein the strobe transmission line includes balanced positive and negative microstrips, and the means for maintaining substantially constant strobe amplitude includes impedance steps in the microstrips at the plurality of positions.

13. The high speed sampler of claim 1, wherein the sample transmission line and strobe transmission line are configured for co-propagating input and strobe signals.

14. The high speed sampler of claim 1, further including means, coupled to the sampler circuitry, for sequentially scanning out the plurality of samples at a rate slower than the time between samples.

15. The high speed sampler of claim 1, further including an anti-aliasing filter connected to the sample transmission line for filtering the input signal.

16. The high speed sampler of claim 1, further including means for inductively compensating the sampler circuitry.

17. A high speed sampler, comprising:
a sample transmission line for transmitting an input signal;
a strobe transmission line for transmitting a strobe signal; and
sampler circuitry having a plurality of positions connected to the strobe transmission line and the sample transmission line, which samples the input signal at the plurality of positions in response to the strobe signal to supply a plurality of samples of the input signal, wherein the plurality of samples are spaced in time on the input signal by less than about 150 picoseconds, the sampler circuitry further includes a plurality of sample holding capacitors at respective ones of the plurality of positions, and the sample holding capacitors include a relatively smaller first capacitor, a relatively larger second capacitor, and a resistor connected between the first and second capacitors.

18. A high speed sampler, comprising:
a sample transmission line for transmitting an input signal;
a strobe transmission line for transmitting a strobe signal;
sampler circuitry having a plurality of positions connected to the strobe transmission line and the sample transmission line, which samples the input signal at the plurality of positions in response to the strobe signal to supply a plurality of samples of the input signal, wherein the plurality of samples are spaced in time on the input signal by less than about 150 picoseconds: and
a multi-layer circuit board having the sample transmission lines on a first layer, a ground plane on a second layer, and the strobe transmission line on a third layer isolated from the sample transmission line on the first layer by the ground plane on the second layer.

19. The high speed sampler of claim 18, wherein the strobe transmission line includes balanced positive and negative microstrips on the third layer, and further including a balun comprising a tapered microstrip having a wider end and a narrower end on the first layer and a substantially overlapping tapered microstrip having a wider end and a narrower end on the third layer, each coupled at the narrower ends to respective ones of the positive and negative microstrips.

20. A high speed sampler, comprising:
a sample transmission line for transmitting an input signal
a strobe transmission line for transmitting a strobe signal;
sampler circuitry having a plurality of positions connected to the strobe transmission line and the sample transmission line, which samples the input signal at the plurality of positions in response to the strobe signal to supply a plurality of samples of the input signal, wherein the plurality of samples are spaced in time on the input signal by less than about 150 picoseconds, the high speed sampler further including means, coupled to the sampler circuitry, for sequentially scanning out the plurality of samples at a rate slower than the time between samples; and
a sample reconstruction filter connected to receive the scanned out samples from the means for sequentially scanning, and supply an analog reconstruction representative of the sampled input signal.

21. A high speed sampler, comprising:
a sample transmission line for transmitting an input signal;
a strobe transmission line for transmitting a strobe signal, the strobe transmission line further including balanced positive and negative strobe lines;
sampler circuitry having a plurality of positions connected to the strobe transmission line and the sample transmission line, which samples the input signal at the plurality of positions in response to the strobe signal to supply a plurality of samples of the input signal, wherein the plurality of samples are spaced in time on the input signal by less than about 150 picoseconds, the sampler circuitry further including a plurality of diode bridge sample gates having relatively high impedance strobe line inputs connected to the sample transmission line at respective ones of the plurality of positions, the sample gates each include a plurality of diodes configured as a four terminal bridge having first, second, third, and fourth terminals, a first strobe resistor connected to the first terminal of the bridge and to the positive strobe line, a second strobe resistor connected to the third terminal of the bridge and to the negative strobe line, a tap connected to the second terminal of the bridge and to the sample transmission line, and a sample holding capacitor connected to the fourth terminal of the bridge; and
inductive means connected between the tap and the second terminal of the bridge and second inductive means connected between the charge holding capacitor and the fourth terminal of the bridge.

22. A high speed sampler, comprising:
a sample transmission line for transmitting an input signal;
a strobe transmission line for transmitting a strobe signal, including balanced positive and negative strobe lines, the strobe lines including respective conductive strips; and
sampler circuitry, having a plurality of sample gates at respective positions connected with the conductive strips of the strobe transmission line and with the sample transmission line, which samples the input signal at the plurality of positions in response to the strobe signal to supply a plurality of samples of the input signal; at least one of the plurality of sample gates including
a plurality of diodes configured as a four terminal bridge having first, second, third, and fourth terminals;
a first strobe resistor connected to the first terminal of the bridge and to the positive strobe line;
a second strobe resistor connected to the third terminal of the bridge and to the negative strobe line;
a tap connected to the second terminal of the bridge and to the sample transmission line; and
a sample holding capacitor connected to the fourth terminal of the bridge.

23. The high speed sampler of claim 22, wherein the sample transmission line comprises a conductive strip which meanders between the plurality of positions, and the balanced positive and negative strobe lines comprise essentially straight conductive strips between the plurality of positions, so that propagation times between respective ones of the plurality of sample gates are longer for the input signal than for the strobe signal.

24. The high speed sampler of claim 22, wherein propagation times between sample gates in the plurality of sample gates are longer for the input signal on the sample transmission line than for the strobe signal on the strobe transmission line.

25. The high speed sampler of claim 22, further including means coupled with the sample transmission line for compensating for capacitive loading of the sample gates at the plurality of positions.

26. The high speed sampler of claim 25, wherein the sample transmission line comprises a microstrip, and the means for compensating includes reduced-width sections of the microstrip at the plurality of positions.

27. The high speed sampler of claim 22, further including means coupled with the strobe transmission line for maintaining substantially constant strobe amplitude at the plurality of positions.

28. The high speed sampler of claim 22, wherein the sample transmission line and strobe transmission line are configured for co-propagating input and strobe signals.

29. The high speed sampler of claim 22, further including means, coupled to the sampler circuitry, for sequentially scanning out the plurality of samples at a rate slower than the time between samples.

30. The high speed sampler of claim 22, further including an anti-aliasing filter connected to the sample transmission line for filtering the input signal.

31. The high speed sampler of claim 22, wherein the resistance of the first strobe resistor and second strobe resistor are substantially higher than the impedance of the sample transmission line.

32. The high speed sampler of claim 22, wherein the plurality of positions are uniformly spaced along the sample transmission line.

33. The high speed sampler of claim 22, wherein the plurality of positions are non-uniformly spaced along the sample transmission line.

34. A high speed sampler, comprising:
a sample transmission line for transmitting an input signal;
a strobe transmission line for transmitting a strobe signal, including balanced positive and negative strobe lines;
sampler circuitry having a plurality of sample gates at respective positions connected to the strobe transmission line and the sample transmission line, for sampling the input signal at the plurality of positions in response to the strobe signal to supply a plurality of samples of the input signal wherein at least one of the plurality of sample gates includes
a plurality of diodes configured as a four terminal bridge having first, second, third, and fourth terminals;
a first strobe resistor connected to the first terminal of the bridge and to the positive strobe line;
a second strobe resistor connected to the third terminal of the bridge and to the negative strobe line;
a tap connected to the second terminal of the bridge and to the sample transmission line; and
a sample holding capacitor connected to the fourth terminal of the bridge; and
means coupled with the strobe transmission line for maintaining substantially constant strobe amplitude at the plurality of positions, the maintaining means further including impedance steps in the balanced positive and negative strobe lines at the plurality of positions.

35. A high speed sampler, comprising:
a sample transmission line for transmitting an input signal;
a strobe transmission line for transmitting a strobe signal, including balanced positive and negative strobe lines; and
sampler circuitry having a plurality of sample gates at respective positions connected to the strobe transmission line and the sample transmission line, for sampling the input signal at the plurality of positions in response to the strobe signal to supply a plurality of samples of the input signal wherein at least one of the plurality of sample gates includes
a plurality of diodes configured as a four terminal bridge having first, second third and fourth terminals;
a first strobe resistor connected to the first terminal of the bridge and to the positive strobe line;
a second strobe resistor connected to the third terminal of the bridge and to the negative strobe line;
a tap connected to the second terminal of the bridge and to the sample transmission line; and
a sample holding capacitor connected to the fourth terminal of the bridge; wherein the sample holding capacitor includes a relatively smaller first capacitor, a relatively larger second capacitor, and a resistor connected between the first and second capacitors.

36. A high speed sampler comprising:
a sample transmission line for transmitting an input signal;
a strobe transmission line for transmitting a strobe signal including balanced positive and negative strobe lines;
sampler circuitry having a plurality of sample gates at respective positions connected to the strobe transmission line and the sample transmission line for sampling the input signal at the plurality of positions in response to the strobe signal to supply a plurality of samples of the input signal wherein at least one of the plurality of sample gates includes
a plurality of diodes configured as a four terminal bridge having first, second, third, and fourth terminals;
a first strobe resistor connected to the first terminal of the bridge and to the positive strobe line;
a second strobe resistor connected to the third terminal of the bridge and to the negative strobe line;
a tap connected to the second terminal of the bridge and to the sample transmission line; and
a sample holding capacitor connected to the fourth terminal of the bridge; and
a multi-layer circuit board having the sample transmission lines on a first layer, a ground plane on a second layer, and the balanced positive and negative strobe lines on a third layer isolated from the sample transmission line on the first layer by the ground plane on the second layer.

37. The high speed sampler of claim 36, wherein the balanced positive and negative strobe lines comprise respective microstrips on the third layer, and further including a balun comprising a tapered microstrip having a wider end and a narrower end on the first layer and a substantially overlapping tapered microstrip having a wider end and a narrower end on the third layer, each coupled at the narrower ends to the respective microstrips.

38. A high speed sampler, comprising:
a sample transmission line for transmitting an input signal;
a strobe transmission line for transmitting a strobe signal, including balanced positive and negative strobe lines;
sampler circuitry having a plurality of sample gates at respective positions connected to the strobe transmission line and the sample transmission line, for sampling the input signal at the plurality of positions in response to the strobe signal to supply a plurality of samples of the input signal wherein at least one of the plurality of sample gates includes a plurality of diodes configured as a four terminal bridge having first, second, third, and fourth terminals;

a first strobe resistor connected to the first terminal of the bridge and to the positive strobe line;

a second strobe resistor connected to the third terminal of the bridge and to the negative strobe line;

a tap connected to the second terminal of the bridge and to the sample transmission line; and a sample holding capacitor connected to the fourth terminal of the bridge;

means for sequentially scanning out the plurality of samples at a rate slower than the time between samples; and a sample reconstruction filter connected to receive the scanned out samples from the means for sequentially scanning, and supply an analog reconstruction representative of the sampled input signal.

39. A high speed sampler, comprising:

a sample transmission line for transmitting an input signal;

a strobe transmission line for transmitting a strobe signal, including balanced positive and negative strobe lines:

sampler circuitry having a plurality of sample gates at respective positions connected to the strobe transmission line and the sample transmission line, for sampling the input signal at the plurality of positions in response to the strobe signal to supply a plurality of samples of the input signal wherein at least one of the plurality of sample gates includes a plurality of diodes configured as a four terminal bridge having first, second, third, and fourth terminals;

a first strobe resistor connected to the first terminal of the bridge and to the positive strobe line:

a second strobe resistor connected to the third terminal of the bridge and to the negative strobe line;

a tap connected to the second terminal of the bridge and to the sample transmission line: and a sample holding capacitor connected to the fourth terminal of the bridge; and first inductive means connected between the tap and the second terminal of the bridge and second inductive means connected between the charge holding capacitor and the fourth terminal of the bridge.

40. A high speed sampler, comprising:

a multi-layer circuit board;

a sample transmission line on a first layer of the circuit board for transmitting an input signal;

a ground plane on a second layer of the circuit board;

a strobe transmission line on a third layer of the circuit board for transmitting a strobe signal, and isolated by the ground plane from the sample transmission line, and sampler circuitry, having a plurality of positions on the circuit board connected to the strobe transmission line and the sample transmission line, which samples the input signal at the plurality of positions in response to the strobe signal to supply a plurality of samples of the input signal.

41. The high speed sampler of claim 40, wherein the sampler circuitry includes a plurality of diode bridge sample gates connected to the sample transmission line at respective ones of the plurality of positions.

42. The high speed sampler of claim 41, wherein the strobe transmission line includes balanced positive and negative strobe lines, and the sample gates each include:

a plurality of diodes configured as a four terminal bridge having first, second, third, and fourth terminals;

a first strobe resistor connected to the first terminal of the bridge and to the positive strobe line;

a second strobe resistor connected to the third terminal of the bridge and to the negative strobe line;

a tap connected to the second terminal of the bridge and to the sample transmission line; and a sample holding capacitor connected to the fourth terminal of the bridge.

43. The high speed sampler of claim 42, further including inductive means connected between the tap and the second terminal of the bridge and second inductive means connected between the charge holding capacitor and the fourth terminal of the bridge.

44. The high speed sampler of claim 42, wherein the resistance of the first strobe resistor and second strobe resistor are substantially higher than the impedance of the sample transmission line.

45. The high speed sampler of claim 40, wherein the sample transmission line comprises a conductive strip which meanders between the plurality of positions, and the strobe transmission line includes balanced positive and negative conductive strips which are essentially straight between the plurality of positions, so that propagation times between respective ones of the plurality of positions are longer for the input signal than for the strobe signal.

46. The high speed sampler of claim 40, wherein propagation times between respective ones of the plurality of positions are longer for the input signal on the sample transmission line than for the strobe signal on the strobe transmission line.

47. The high speed sampler of claim 40, further including means coupled with the sample transmission line for compensating for capacitive loading of the sampling means at the plurality of positions.

48. The high speed sampler of claim 47, wherein the sample transmission line comprises a microstrip, and the means for compensating includes reduced-width sections of the microstrip at the plurality of positions.

49. The high speed sampler of claim 40, further including means coupled with the strobe transmission line for maintaining substantially constant strobe amplitude at the plurality of positions.

50. The high speed sampler of claim 49, wherein the strobe transmission line includes balanced positive and negative microstrips, and the means for maintaining substantially constant strobe amplitude includes impedance steps in the microstrips at the plurality of positions.

51. The high speed sampler of claim 40, wherein the sample transmission line and strobe transmission line are configured for co-propagating input and strobe signals.

52. The high speed sampler of claim 40, wherein the sampler circuitry includes a plurality of sample holding capacitors at respective ones of the plurality of positions, and the sample holding capacitors include a relatively smaller first capacitor, a relatively larger second capacitor, and a resistor connected between the first and second capacitors.

53. The high speed sampler of claim 40, wherein the strobe transmission line includes balanced positive and negative microstrips on the third layer, and further including a balun comprising a tapered microstrip having a wider end and a narrower end on the first layer and a substantially overlapping tapered microstrip having a wider end and a narrower end on the third layer, each coupled at the narrower ends to respective ones of the positive and negative microstrips.

54. The high speed sampler of claim 40, further including means, coupled to the sampler circuitry, for sequentially scanning out the plurality of samples at a rate slower than the time between samples.

55. The high speed sampler of claim 54, further including a sample reconstruction filter connected to receive the scanned out samples from the means for sequentially scanning, and supply an analog reconstruction representative of the sampled input signal.

56. The high speed sampler of claim 40, further including an anti-aliasing filter connected to the sample transmission line for filtering the input signal.

57. The high speed sampler of claim 40, further including means for inductively compensating the sampler circuits.

58. The high speed sampler of claim 40, wherein the plurality of positions are uniformly spaced along the sample transmission line.

59. The high speed sampler of claim 40, wherein the plurality of positions are non-uniformly spaced along the sample transmission line.

60. A high speed sampler, comprising:
a plurality of sampler banks, each bank including
a sample transmission line for transmitting a bank input signal;
a strobe transmission line including a conductive strip for transmitting a bank strobe signal; and
sampler circuitry, having a plurality of positions coupled with the conductive strip of the strobe transmission line and coupled with the sample transmission line, which samples the bank input signal at the plurality of positions in response to the bank strobe signal to supply a plurality of samples of the input signal;
input circuitry, coupled with the plurality of sampler banks, which supplies an input signal to the sample transmission lines in each of the plurality of banks in parallel;
strobe control circuitry, coupled with the plurality of sampler banks, which supplies the bank strobe signals to the strobe transmission lines in each of the plurality of banks, including circuits for controlling timing of the bank strobe signals.

61. The high speed sampler of claim 60, wherein the circuitry for controlling timing incrementally delays the bank strobe signals so that the samples in respective pluralities of samples from at least a subset of the plurality of banks are interleaved in time.

62. The high speed sampler of claim 60, wherein the circuitry for controlling timing incrementally delays the bank strobe signals so that the samples in respective pluralities of samples from at least a subset of the plurality of banks are concatenated in time.

63. The high speed sampler of claim 60, wherein the sampler circuitry in at least one bank includes a plurality of diode bridge sample gates connected to the sample transmission line at respective ones of the plurality of positions.

64. The high speed sampler of claim 63, wherein the strobe transmission lines include balanced positive and negative strobe lines, and the sample gates each include:
a plurality of diodes configured as a four terminal bridge having first, second, third, and fourth terminals;
a first strobe resistor connected to the first terminal of the bridge and to the positive strobe line;
a second strobe resistor connected to the third terminal of the bridge and to the negative strobe line;
a tap connected to the second terminal of the bridge and to the sample transmission line; and
a sample holding capacitor connected to the fourth terminal of the bridge.

65. The high speed sampler of claim 60, wherein the sample transmission lines in the plurality of banks comprise substantially identical conductive strips which meander between the plurality of positions in the sampler circuitry, and the strobe transmission lines includes balanced positive and negative conductive strips which are essentially straight between the plurality of positions, so that propagation times between respective ones of the plurality of positions are longer for the input signal than for the bank strobe signal.

66. The high speed sampler of claim 60, wherein propagation times between respective ones of the plurality of positions in the sampler circuitry in the plurality of banks are longer for the input signal on the sample transmission line than for the bank strobe signal on the strobe transmission line.

67. The high speed sampler of claim 60, wherein the sample transmission lines and strobe transmission lines in the plurality of banks are configured for co-propagating input and strobe signals.

68. The high speed sampler of claim 60, further including means, coupled to the sampler circuitry in the plurality of banks, for scanning out the samples from the plurality of banks in coordination with the circuits for controlling timing.

69. The high speed sampler of claim 60, wherein the input means includes an anti-aliasing filter for filtering the input signal.

70. The high speed sampler of claim 60, wherein the plurality of positions in at least one of the plurality of sampler banks are uniformly spaced along the sample transmission line.

71. The high speed sampler of claim 60, wherein the plurality of positions in at least one of the plurality of sampler banks are non-uniformly spaced along the sample transmission line.

72. A high speed sampler comprising:
a plurality of sampler banks, each bank including
a sample transmission line for transmitting a bank input signal;
a strobe transmission line for transmitting a bank strobe signal:
sampler circuitry having a plurality of positions connected to the strobe transmission line and the sample transmission line, which samples the bank input signal at the plurality of positions in response to the bank strobe signal to supply a plurality of samples of the input signal;
input circuitry, coupled with the plurality of sampler banks, which supplies an input signal to the sample transmission lines in each of the plurality of banks in parallel;
strobe control circuitry coupled with the plurality of sampler banks, which supplies the bank strobe signals to the strobe transmission lines in each of the plurality of banks, including circuits for controlling timing of the bank strobe signals: and
a multi-layer circuit board having the sample transmission lines of at least a subset of the plurality of banks on a first layer, a ground plane on a second layer, and the strobe transmission lines of at least the subset of the plurality of banks on a third layer isolated from the sample transmission lines on the first layer by the ground plane on the second layer.

73. A high speed sampler, comprising:
a plurality of sampler banks, each bank including
a sample transmission line for transmitting a bank input signal:

a strobe transmission line for transmitting a bank strobe signal;

sampler circuitry having a plurality of positions connected to the strobe transmission line and the sample transmission line, which samples the bank input signal at the plurality of positions in response to the bank strobe signal to supply a plurality of samples of the input signal;

input circuitry, coupled with the plurality of sampler banks, which supplies an input signal to the sample transmission lines in each of the plurality of banks in parallel;

strobe control circuitry, coup led with the plurality of sampler banks, which supplies the bank strobe signals to the strobe transmission lines in each of the plurality of banks, including circuits for controlling timing of the bank strobe signals;

means, coupled to the sampler circuitry in the plurality of banks, for scanning out the samples from the plurality of banks in coordination with the means for controlling timing: and a sample reconstruction filter connected to receive the scanned out samples from the means for scanning, and supply an analog reconstruction representative of the sampled input signal.

74. A high speed sampler, comprising:

a sample transmission line for transmitting an input signal;

a strobe transmission line including a conductive strip for transmitting a strobe signal; and sampler circuitry, having a plurality of positions coupled with the conductive strip of the strobe transmission line and with the sample transmission line, which samples the input signal at the plurality of positions in response to the strobe signal to supply a plurality of samples of the input signal, wherein propagation times between respective ones of the plurality of positions are longer for the input signal on the sample transmission line than for the strobe signal on the strobe transmission line;

wherein the sample transmission line and the strobe transmission line are configured for copropagating input and strobe signals so that the difference in propagation times between the plurality of positions defines the sample spacing in time.

75. The high speed sampler of claim 74, wherein the sample transmission line comprises a conductive strip which meanders between the plurality of positions, and the strobe transmission line includes balanced positive and negative conductive strips which are essentially straight between the plurality of positions.

76. The high speed sampler of claim 74, wherein the sampler circuitry includes a plurality of diode bridge sample gates connected to the sample transmission line at respective ones of the plurality of positions.

77. The high speed sampler of claim 74, wherein the strobe transmission line includes balanced positive and negative strobe lines, and the sample gates each include:

a plurality of diodes configured as a four terminal bridge having first, second, third, and fourth terminals;

a first strobe resistor connected to the first terminal of the bridge and to the positive strobe line;

a second strobe resistor connected to the third terminal of the bridge and to the negative strobe line;

a tap connected to the second terminal of the bridge and to the sample transmission line; and a sample holding capacitor connected to the fourth terminal of the bridge.

78. The high speed sampler of claim 74, further including means coupled with the sample transmission line for compensating for capacitive loading of the sampler circuitry at the plurality of positions.

79. The high speed sampler of claim 78, wherein the sample transmission line comprises a microstrip, and the means for compensating includes reduced-width sections of the microstrip at the plurality of locations.

80. The high speed sampler of claim 74, further including means coupled with the strobe transmission line for maintaining substantially constant strobe amplitude at the plurality of positions.

81. The high speed sampler of claim 80, wherein the strobe transmission line includes balanced positive and negative microstrips, and the means for maintaining substantially constant strobe amplitude includes impedance steps in the microstrips at the plurality of positions.

82. The high speed sampler of claim 74, further including means, coupled to the sampler circuitry, for sequentially scanning out the plurality of samples at a rate slower than the time between samples.

83. The high speed sampler of claim 74, wherein the plurality of positions are uniformly spaced along the sample transmission line.

84. The high speed sampler of claim 74, wherein the plurality of positions are non-uniformly spaced along the sample transmission line.

85. A high speed sampler, comprising:

a sample transmission line for transmitting an input signal which includes a conductive strip which meanders between the plurality of positions;

a strobe transmission line which includes balanced positive and negative conductive strips which are essentially straight between the plurality of positions;

sampler circuits having a plurality of positions connected to the strobe transmission line and the sample transmission line which samples the input signal at the plurality of positions in response to the strobe signal to supply a plurality of samples of the input signal, wherein propagation times between respective ones of the plurality of positions are longer for the input signal on the sample transmission line than for the strobe signal on the strobe transmission line; and a multi-layer circuit board having the sample transmission line on a first layer, a ground plane on a second layer, and the strobe transmission line on a third layer isolated from the sample transmission line on the first layer by the ground plane on the second layer.

86. The high speed sampler of claim 85, wherein the sample transmission line comprises a microstrip tracing a curved path between the plurality of positions.

87. The high speed sampler of claim 85, wherein the sample transmission line comprises a microstrip tracing a substantially identical curved path between each of the plurality of positions.

88. The high speed sampler of claim 85, wherein the sample transmission line comprises a microstrip tracing a substantially identical U-shaped path between each of the plurality of positions.

89. The high speed sampler of claim 85, wherein the strobe transmission line includes balanced positive and negative microstrips on the third layer, and further including a balun comprising a tapered microstrip having a wider end and a narrower end on the first layer and a substantially overlapping tapered microstrip having a wider end and a narrower end on the third layer, each coupled at the narrower ends to respective ones of the positive and negative microstrips.

90. A high speed sampler, comprising;
- a sample transmission line for transmitting an input signal;
- a strobe transmission line including a conductive strip for transmitting a strobe signal;
- sampler circuitry, having a plurality of positions connected to the strobe transmission line and the sample transmission line, which samples the input signal at the plurality of positions in response to the strobe signal to supply a plurality of samples of the input signal, wherein propagation times between respective ones of the plurality of positions are longer for the input signal on the sample transmission line than for the strobe signal on the strobe transmission line:
- means, coupled to the sampler circuitry, for sequentially scanning out the plurality of samples at a rate slower than the time between samples; and
- a sample reconstruction filter connected to receive the scanned out samples from the means for sequentially scanning, and supply an analog reconstruction representative of the sampled input signal.

91. The high speed sampler of claim 90, further including an anti-aliasing filter connected to the sample transmission line for filtering the input signal.

* * * * *